United States Patent
Egawa et al.

(10) Patent No.: US 7,680,165 B2
(45) Date of Patent: Mar. 16, 2010

(54) LIGHT SOURCE DEVICE, MONITOR DEVICE, PROJECTOR, AND DRIVING METHOD FOR DRIVING LIGHT SOURCE DEVICE

(75) Inventors: Akira Egawa, Shiojiri (JP); Kiyoto Sudo, Matsumoto (JP); Kazuhisa Mizusako, Chino (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 12/081,005

(22) Filed: Apr. 9, 2008

(65) Prior Publication Data

US 2008/0253418 A1 Oct. 16, 2008

(30) Foreign Application Priority Data

Apr. 10, 2007 (JP) ............................. 2007-102444
Jun. 13, 2007 (JP) ............................. 2007-156304
Apr. 9, 2008 (JP) ............................. 2008-101943

(51) Int. Cl.
 *H01S 3/00* (2006.01)
(52) U.S. Cl. ................................. 372/38.02; 372/38.07
(58) Field of Classification Search .............. 372/38.02, 372/38.07
 See application file for complete search history.

(56) References Cited

U.S. PATENT DOCUMENTS 5,887,012 A * 3/1999 Yamada ................... 372/50.12

2005/0094691 A1 * 5/2005 Yamazaki et al. ......... 372/38.03
2007/0091977 A1 * 4/2007 Sohn et al. .................. 372/109

FOREIGN PATENT DOCUMENTS

JP A-06-160811 6/1994

OTHER PUBLICATIONS

Mooradian et al. "High Power Extended Vertical Cavity Surface Emitting Diode Lasers and Arrays and Their Applications". *Micro-Optics Conference*, Tokyo, Nov. 2, 2005, pp. 1-4.

* cited by examiner

*Primary Examiner*—Minsun Harvey
*Assistant Examiner*—Tod T Van Roy
(74) *Attorney, Agent, or Firm*—Oliff & Berridge, PLC

(57) ABSTRACT

A light source device includes: a plurality of laser light sources that emit laser light; and a light source driving section that drives at least one of the laser light sources by a first driving value that is a value less than a threshold level of at least one of the laser light sources, or by a second driving value that is a value greater than a threshold level of at least one of the laser light sources, and that varies at least one of the number of laser light sources that are driven by the first driving value and the number of laser light sources that are driven by the second driving value in the laser light sources, thereby controlling the total output of laser light emitted from the laser light sources.

20 Claims, 13 Drawing Sheets

PASSAGE OF TIME

LIGHT SOURCE DEVICE, MONITOR DEVICE, PROJECTOR, AND DRIVING METHOD FOR DRIVING LIGHT SOURCE DEVICE

CROSS-REFERENCE TO RELATED APPLICATION

This application is based on and claims priority from Japanese Patent Application No. 2007-102444, filed on Apr. 10, 2007, Japanese Patent Application No. 2007-156304, filed on Jun. 13, 2007, and Japanese Patent Application No. 2008-101943, filed on Apr. 9, 2008, the contents of which are incorporated herein by reference.

BACKGROUND

1. Technical Field

The present invention relates to a light source device, a monitor device, a projector, and a driving method for driving a light source device.

2. Related Art

A projection-type liquid crystal projector that uses a liquid crystal panel as a light valve and that will be an available means for projecting onto a large screen under development is flourishingly today.

In a projector of this type, a high luminance of a light source is required for reproduction of a bright picture.

However, actually, it is impossible to completely intercept light from a light source because a liquid crystal panel is used.

Thus, when displaying a real image, a black float caused by leaks of light or the like occurs depending on the increasing brightness of a light source. Therefore, increase of luminance in a light source does not always improve contrast of the image.

Furthermore, an increase of luminance in a light source brings a disadvantage from the viewpoint of a heat-resistant of liquid crystal panel. Especially, when a dark image is displayed on an entire screen via a liquid crystal panel, the amount of shading in the liquid crystal panel is large. Therefore, heat absorption in a liquid crystal panel or a polarization plate increases, and it is connected to damage of liquid crystal panels.

On the other hand, as suggested in Japanese Unexamined Patent Application, First Publication No. H06-160811, for example, a method for controlling contrast by varying the output of a light source based on a peak signal of an image, as a means that solves a black float depending on a high luminance of a light source and a problem in that damage occurs due to heat absorption in a liquid crystal panel, a polarization plate, or the like.

However, the metal halide lamp that is described in Japanese Unexamined Patent Application, First Publication No. H06-160811, has a problem in that the illumination color temperature that causes the output of a light source to vary is limited, in that the length of time of emission is short, in the impossibility of quick lighting and intermittent lighting, or the like.

Thus, a laser light source is expected as a light source overcoming the above-described problems.

However, each laser light source has each output characteristic, and there are differences between the output characteristics of each of the laser light sources. Particularly, the influences of the individual differences remarkably occur in the vicinity of the threshold level of each laser light source. Even if the same electricity is input to the laser light sources, a great difference in the output of each laser light source may occur.

Therefore, in order to vary the output from a light source in the case of using a plurality of laser lights, even if the electric current supply is continuously varied and the amount of laser light is controlled as disclosed in Japanese Unexamined Patent Application, First Publication No. H06-160811, the output (amount of light emitted) of each of the laser light sources is different from each other. As a result, there is a problem in that it is difficult to obtain a desired output (amount of light emitted).

SUMMARY

An advantage of some aspects of the invention is to provide a light source device, a monitor device, a projector, and a driving method for driving a light source device in which it is possible to reliably control the output (amount of light emitted), while reducing the influence of individual differences in the laser light sources, when using a plurality of laser light sources. Furthermore, an advantage of one aspect of the invention is to provide a projector with higher-resolution by reliably controlling the output of the light source in accordance with image signals or the like.

A first aspect of the invention provides a light source device including: a plurality of laser light sources that emit laser light; and a light source driving section that drives at least one of the laser light sources by a first driving value that is a value less than a threshold level of at least one of the laser light sources, or by a second driving value that is a value greater than a threshold level of at least one of the laser light sources, and that varies at least one of the number of laser light sources that are driven by the first driving value and the number of laser light sources that are driven by the second driving value in the laser light sources, thereby controlling the total output of laser light emitted from the laser light sources.

The "driving value" in this specification is a concept including electric current value, voltage value, electric power value, or the like, that is a control parameter when the laser light source is driven.

Also, the "threshold level" in this specification is defined as the driving value when the gradient represented by the output divided by the driving value is maximized in the output characteristic curve that indicates the relationship between "driving value supplied to laser light source (e.g., electric current value)" and "output from laser light source (e.g., amount of light emitted)". Details are described below. When the light source device includes a plurality of the laser light sources, if the driving value that supplies each laser light source is continuously varied (analog modulation), the irregularity of output characteristics of every laser light source greatly influences, and it is difficult to accurately control the total amount of light emitted from the laser light sources.

In contrast, since the total amount of laser light is controlled by varying at least one of the number of laser light sources that are driven by the first driving value and the number of laser light sources that are driven by the second driving value, the influence of the irregularity of output characteristics of every laser light source decreases, it is thereby possible to accurately control the total amount of light emitted.

That is, since the light source device of the invention drives each laser light source by discrete driving values such as a first driving value or a second driving value (the number of values may be at least two values, or greater than or equal to three values), it is possible to reduce the influence of the irregularity of output characteristics of every laser light source compared with continuously varying the driving value.

Specifically, the first driving value is a value less than the threshold level of at least one laser light source, and the second driving value is a value greater than the threshold level of at least one laser light source.

Since the first and second driving values are different from the "threshold level" at which the individual differences of the characteristics is maximized, it is possible to desirably reduce the influence of the irregularity of output characteristics.

In the invention, since the "threshold level" is defined as the point at which the gradient represented by the output divided by the driving value is maximized in the output characteristic curve, the threshold level is positioned at substantially the center of the region (transitional region) where the amount of light emitted rises depending on an increase of the driving value in the output characteristic curve.

The center position of the transitional region described above is the position at which the individual differences of the characteristics of the laser light source is maximized.

As described above, the first and second driving value may be a value less than or greater than the threshold level of at least one of the laser light sources.

It is preferable that, in the light source device of the first aspect of the invention, the first driving value be a value less than a lowest threshold level of the threshold levels of the laser light sources, and the second driving value be a value greater than a highest threshold level of the threshold levels of the laser light sources.

According to this constitution, the first and second driving values are set to values that are different from the threshold levels of the whole laser light sources of the light source device, and it is thereby possible to further efficiently reduce the influence of the irregularity of output characteristics.

It is preferable that, in the light source device of the first aspect of the invention, the first driving value be a driving value by which the output of all of the laser light sources is zero, and the second driving value be a value greater than a driving value by which output of all of the laser light sources is maximized.

For example, when supposing that the output characteristic curve in which the driving value (e.g., electric current value) is indicated in the abscissa axis and the output (e.g., amount of light emitted) is indicated in the ordinate axis, according to the individual differences between the laser light sources in the output characteristic curves, the shift (irregularity) in the axis of abscissa (magnitude of driving value) is generally greater than the shift (irregularity) in the axis of ordinate (magnitude of output).

Therefore, if setting the first driving value to the driving value at which the output of all the laser light sources will be zero, and if setting the second driving value to the value greater than the driving value at which the output of all the laser light sources will be maximized, it is possible to farther reduce the influence of the irregularity of output characteristics.

It is preferable that, in the light source device of the first aspect of the invention, the light source driving section be connected in series with at least one of the laser light sources, and include a switching circuit supplying the laser light source with one of the first driving value and the second driving value.

That is, in the light source device of the first aspect of the invention, the constitution in which one of the first driving value and the second driving value is supplied by the switching circuit to the laser light source connected with the switching circuit may be adopted.

According to this constitution, by controlling the switching circuit that is connected with the laser light source in series, for example, by controlling two-values, it is possible to comparatively and easily perform the driving of the laser light source due to the first driving value and the second driving value.

It is preferable that, in the light source device of the first aspect of the invention, the light source driving section include: the switching circuit connected in series with one of the laser light sources; and a driving value adjusting circuit connected in series with a light-amount-adjusting laser light source that is not connected to the switching circuit. In the light source device, one of the first driving value and the second driving value is supplied by the switching circuit to the laser light source that is connected with the switching circuit, and the driving value that is supplied to the light-amount-adjusting laser light source connected with the driving value adjusting circuit is adjusted by the driving value adjusting circuit.

For example, the constitution may be used in which the switching circuit is connected in series with all of laser light sources and which is driven by the first driving value or by the second driving value. However, in this constitution, the amount of light emitted that is obtained indicates desultory values (discrete values).

It is conceivable to increase the number of laser light sources (to increase the number of the gradations), as a method for desirably continuously adjusting the amount of light emitted. However, there is a demerit of increasing the size of the device.

At this point, when the above-described constitution is adopted, the driving value adjusting circuit continuously (analog modulation) and fitly adjusts the driving value that is supplied to the light-amount-adjusting laser light source. Also, the driving value adjusting circuit completes the desultory values of the total amount of light emitted that is obtained due to the driving by the first and second driving values. Therefore, it is possible to reliably control the discrete amount of light emitted corresponding to the number of the laser light sources, and to further finely adjust the amount of light emitted, without increasing the size of the device.

It is preferable that the light source device of the first aspect of the invention further include: a light amount detection section that detects an amount of light that is emitted from the light-amount-adjusting laser light source. In the light source device, the driving value adjusting circuit adjusts the driving value that is supplied to the light-amount-adjusting laser light source, based on the amount of light emitted that is detected by the light amount detection section.

In this constitution, the light emitted from the light-amount-adjusting laser light source is received by the light amount detection section.

The light amount detection section converts the amount of light emitted that has detected into, for example, electrical signal as the amount of electrical detection.

This electrical signal is transmitted to, for example, the light source driving section, and output to the driving value adjusting circuit after performing a computing process at the light source driving section.

The driving value adjusting circuit adjusts the driving value that is supplied to the light-amount-adjusting laser light source based on the amount of light detected by the light amount detection section, that is, the amount of light that is emitted from the light-amount-adjusting laser light source.

According to this constitution, the driving value adjusting circuit performs feedback control based on the amount of light that has been actually emitted from the light-amountadjusting laser light source, and can adjust the driving value that is supplied to the light-amount-adjusting laser light source.

Therefore, it is possible to reliably control the discrete amount of light emitted corresponding to the number of the laser light sources, and to finely adjust the amount of light emitted. Furthermore, it is possible to adjust the amount of light emitted with a high level of precision.

It is preferable that, in the light source device of the first aspect of the invention, the light amount detection section include an optical element that leads a part of the light emitted from the light-amount-adjusting laser light source.

There is a case in which, the light amount detection section cannot reliably detect the light emitted from the light-amount-adjusting laser light source caused by, for example, the positional relationship between the light amount detection section and the light-amount-adjusting laser light source.

According to the invention, the light that has been emitted from the light-amount-adjusting laser light source is incident into the optical element. The optical element leads the light emitted from the light-amount-adjusting laser light source to the optical element.

Therefore, the optical element complements a function of light detection by the light amount detection section, and can reliably lead the light to the light amount detection section.

It is preferable that, in the light source device of the first aspect of the invention, the optical element constitute a part of a uniformization optical element that uniformizes the illumination distribution of the light emitted from the laser light sources and the light-amount-adjusting laser light source.

The uniformization optical element may be provided on an exterior of the light source device.

Furthermore, the uniformization optical element may be included in the optical device having the light source device, such as a monitor device or a projector.

As a result, it is possible to achieve a reduction in the number of components that constitute the optical device including the light source device.

It is preferable that, in the light source device of the first aspect of the invention, the optical element be a Computer Generated Hologram.

The Computer Generated Hologram is formed by using a computer to perform physic simulations such as reflection of light, diffraction, interferences, or the like, and to compute the data of interference fringes on a hologram face, and by using a display device or the like.

It is preferable that the light source device of the first aspect of the invention further include: a storage section that stores historical drive information with regard to each of the laser light sources that are turned on or off depending on the passage of time. In the light source device, the light source driving section includes a light source control circuit that selectively drives each of the laser light sources, based on the historical drive information stored in the storage section.

In a light source device including a plurality of laser light sources, when increasing the frequency of driving a specific laser light source of the laser light sources and stopping the other laser light source, the lengths of time during which the laser light sources emit light will be ununiform.

Therefore, the individual differences with regard to the lengths of time during which the laser light sources emit light occur, and there is a problem in that the length of time in which a specific laser light source emits light will be short.

According to the invention, the storage section stores historical information with regard to each of the laser light sources that are turned on or off depending on how much time has passed. That is, the storage section stores the historical drive information with regard to each of the laser light sources.

The historical drive information is stored in the storage section with the light source driving section driving the laser light source.

The light source driving section selectively drives each of the laser light sources based on the historical drive information.

Specifically, the light source driving section synthesizes and calculates the historical drive information that includes a plurality of information with regard to each of the laser light sources, so as to select a laser light source from the laser light sources and to drive the selected laser light source, so that a specific laser light source is not continually driven, or so that a specific laser light source is not at rest.

The amount of light emitted from the light source devices is thereby controlled so that the frequency of the driving of the laser light sources is equalized.

Therefore, in the laser light sources, the number of driving times or the length of the driving time is uniformed, and it is possible to prevent the occurrence of individual differences with regard to the lengths of time during which the laser light sources emit light.

Therefore, the problem of the length of time light is emitted from a specific laser light source being short will be solved. It is possible to extend the average length of time light is emitted from the laser light sources.

It is preferable that, in the light source device of the first aspect of the invention, the laser light sources be configured in an array.

In this constitution, due to a narrowing of the gaps between the mutual laser light sources, uniformization of the amount of light emitted is easy.

In addition, this constitution contributes to miniaturization of a whole light source device, and can also advance the reduction of manufacturing cost in the case of, for example, forming a plurality of laser light sources on a substrate or the like.

A second aspect of the invention provides a monitor device including: the light source device described above; and a capturing section that captures an object that is illuminated by the light source device.

According to the invention, the total amount of laser light that is emitted from the plurality of the laser light sources is controlled by varying at least one of the number of laser light sources that are driven by the first driving value and the number of laser light sources that are driven by the second driving value.

The first electric current value is a value less than the threshold level of at least one laser light source, and the second electric current value is a value greater than the threshold level of at least one laser light source.

It is thereby possible to provide a monitor device that can reliably control the total amount of light emitted while reducing the adverse effects caused by the individual differences between the laser light sources.

Specifically, as the first and second electric current values, the values that are different from the threshold level of laser light at which the great influence of the individual differences in the laser light sources occurs are set. Also, the number of light sources that are driven by the first and second electric current values that are different from the threshold level are controlled. It is thereby possible to reliably control the output.

A third aspect of the invention provides a projector including: the light source device described above; and a modulation section that modulates the light from the light source device in accordance with an image signal.

According to the invention, the total amount of laser light that is emitted from the plurality of the laser light sources is controlled by varying at least one of the number of laser light sources that are driven by the first electric current value and the number of laser light sources that are driven by the second electric current value.

The first electric current value is a value less than the threshold level of at least one laser light source, and the second electric current value is a value greater than the threshold level of at least one laser light source.

Since the output of the light source is reliably controlled in accordance with an image signal while reducing the adverse effects caused by the individual differences between the laser light sources, it is thereby possible to provide a projector with higher-resolution.

Specifically, as the first and second electric current values, the values that are different from the threshold level of laser light at which the great influence of the individual differences in the laser light sources occurs are set. Also, the number of light sources that are driven by the first and second electric current values that are different from the threshold level are controlled. It is thereby possible to reliably control the output.

As a result, it is possible to achieve a projector projecting a superior image with a broad dynamic range due to a combination of an adjustment of the amount of light emitted form the light source and modulation by the modulation section.

A fourth aspect of the invention provides a driving method for driving a light source device, including: driving a plurality of laser light sources by a first driving value that is a value less than a threshold level of at least one of the laser light sources, or by a second driving value that is a value greater than a threshold level of at least one of the laser light sources; and varying at least one of the number of laser light sources that are driven by the first electric current value and the number of laser light sources that are driven by the second electric current value in the laser light sources, thereby controlling the total output of the laser light emitted from the laser light sources.

According to the invention, the total amount of laser light that is emitted from the laser light sources, by varying at least one of the number of laser light sources that are driven by the first electric current value and the number of laser light sources that are driven by the second electric current value.

The first electric current value is a value less than the threshold level of at least one laser light source, and the second electric current value is a value greater than the threshold level of at least one laser light source.

As a result, it is possible to provide the driving method for driving a light source device that can reliably control the total amount of light emitted while reducing the adverse effects caused by the individual differences between the laser light sources.

Specifically, as the first and second electric current values, the values that are different from the threshold level of a laser light at which the great influence of the individual differences in the laser light sources occurs are set. Also, the number of light sources that are driven by the first and second electric current values that are different from the threshold level are controlled. It is thereby possible to reliably control the output.

It is preferable that, in the driving method of the fourth aspect of the invention, the laser light sources include a first laser light source and a second laser light source. In the driving method, the first laser light source is driven by the first driving value or the second driving value, and the second laser light source is driven by varying the driving value that is supplied to the second laser light source, in the driving of the light source.

For example, the constitution in which all of the laser light sources, that are the first laser light source and the second laser light source, are driven by the first driving value or the second driving value may be used. However, in this case, the amount of light emitted that is obtained indicates desultory values (discrete values).

It is conceivable to increase the number of laser light sources, as a method for desirably continuously adjusting the amount of light emitted. However there is a demerit of increasing the size of the device.

At this point, when the above-described constitution is adopted, since the driving value that is supplied to the second laser light source (other laser light source) is continuously (analog modulation) varied, the desultory values of the total amount of light emitted are made completed. It is thereby possible to reliably control the discrete amount of light emitted corresponding to the number of the laser light sources, and to further finely adjust the amount of light emitted, without increasing the size of the device.

It is preferable that, in the driving method of the fourth aspect of the invention, drive of at least one of the laser light sources that has been driven at a first step be stopped at a second step after the first step, and at least one of the laser light sources that has not been driven in the first step be driven at the second step, in the driving of the light source.

As a result, the frequency of the driving of the laser light sources is equalized, and the amount of light emitted from the light source devices is thereby controlled.

Therefore, the number of driving times or the length of the driving time of the laser light sources is uniformed, and it is possible to prevent the occurrence of individual differences with regard to the lengths of time during which the laser light sources emit light.

Therefore, the problem is solved in that the length of time in which a specific laser light source emits light will be short, and it is possible to extend the average length of time the laser light source emits light.

It is preferable that the driving method of the fourth aspect of the invention further include: storing historical drive information with regard to each of the laser light sources that are turned on or off depending on the passage of time. In the driving method, each of the laser light sources is selectively driven based on the historical drive information stored in the storing of the historical drive information, in the driving of the light source.

In the storing of this method, the historical information with regard to each of the laser light sources that are turned on or off depending on the passage of time. That is, the historical drive information with regard to each of the laser light sources is stored.

The historical drive information includes the information of each laser light source that has been previously driven by the light source driving section, specifically, information about the number of driving times of each laser light source, the length of the driving time of each laser light source, the continuous number of driving times, the continuous length of the driving time, whether the laser light source has been emitted or not in the previous step, or the like.

The historical drive information described above is stored in the storage section concurrently with the driving of the light source.

In the driving of the light source, the light source driving section selectively drives each of the laser light sources based on the above-described historical drive information.

Specifically, the light source driving section synthesizes and calculates the historical drive information including the above-described information with regard to each of the laser light sources, and selectively drives the laser light source in the laser light sources so that a specific laser light source is not continually driven or so that a specific laser light source is not at rest.

Therefore, the amount of light emitted from the light source devices is controlled so that the frequency of the driving of the laser light sources is equalized. Therefore, the number of driving times or the length of the driving time of the laser light sources is uniformed, and it is possible to prevent the occurrence of individual differences with regard to the lengths of time during which the laser light sources emit light.

Therefore, the problem is solved in that the length of time in which a specific laser light source emits light will be short, it is possible to extend the average length of time the laser light source emits light.

It is preferable that, in the driving method of the fourth aspect of the invention, the historical drive information include previous drive information with regard to the laser light source and whether or not the laser light source has been driven. In the driving method, drive of the laser light source that has been driven is stopped based on the previous drive information, in the driving of the light source.

As a result, continuous driving of a laser light source is prevented in each of the laser light sources.

Therefore, effects similar to the above-described effects are obtained.

Furthermore, in this method, the light source driving section may cause the laser light source that has been driven to stop, and cause the laser light source that has not been driven to drive.

As a result, continuous stopping can be prevented in each of the laser light sources.

It is preferable that, in the driving method of the fourth aspect of the invention, the historical drive information include cumulative drive information with regard to the cumulative number of driving times or the cumulative length of the driving time of each laser light source. In the driving method, the laser light source whose number of driving times or whose length of driving time is relatively less than that of the laser light sources is driven, and the laser light source whose number of driving times or whose length of driving time is relatively greater than that of the laser light sources is not driven based on the cumulative drive information, in the driving of the light source.

As a result, driving of the laser light source whose number of driving times or whose length of driving time is great is prevented in each of the laser light sources, and stopping of the laser light source whose number of driving times or whose length of driving time is small is prevented in each of the laser light sources.

Therefore, effects similar to the above-described effects are obtained.

It is preferable that, in the driving method of the fourth aspect of the invention, the historical drive information include continuous drive information with regard to the continuous number of driving times or the continuous length of the driving time of each laser light source. In the driving method, the laser light source whose continuous number of driving times or whose continuous length of driving time is relatively less than that of the laser light sources is driven, and the laser light source whose continuous number of driving times or whose continuous length of driving time is relatively greater than that of the laser light sources is not driven based on the continuous drive information, in the driving of the light source.

As a result, driving of the laser light source whose continuous number of driving times or whose continuous length of driving time is great is prevented in each of the laser light sources, and stopping the laser light source whose continuous number of driving times or whose continuous length of driving time is small is prevented in each of the laser light sources.

Therefore, effects similar to the above-described effects are obtained.

It is preferable that, in the driving method of the fourth aspect of the invention, the laser light source be randomly selected from the laser light sources, and the selected laser light source be driven, in the driving of the light source.

As a result, since each of the laser light sources is randomly driven, the frequency of the driving of the laser light sources is equalized, and the amount of light emitted from the light source devices is controlled.

Therefore, effects similar to the above-described effects are obtained.

DESCRIPTION OF EXEMPLARY EMBODIMENTS

Hereinafter, embodiments of the invention will be described with reference to the drawings.

These embodiments are examples in which a light source device of the inventions applied to a semiconductor laser (LD) light source device that is a semiconductor laser array (hereafter, laser light source device).

First Embodiment

Figure 1:
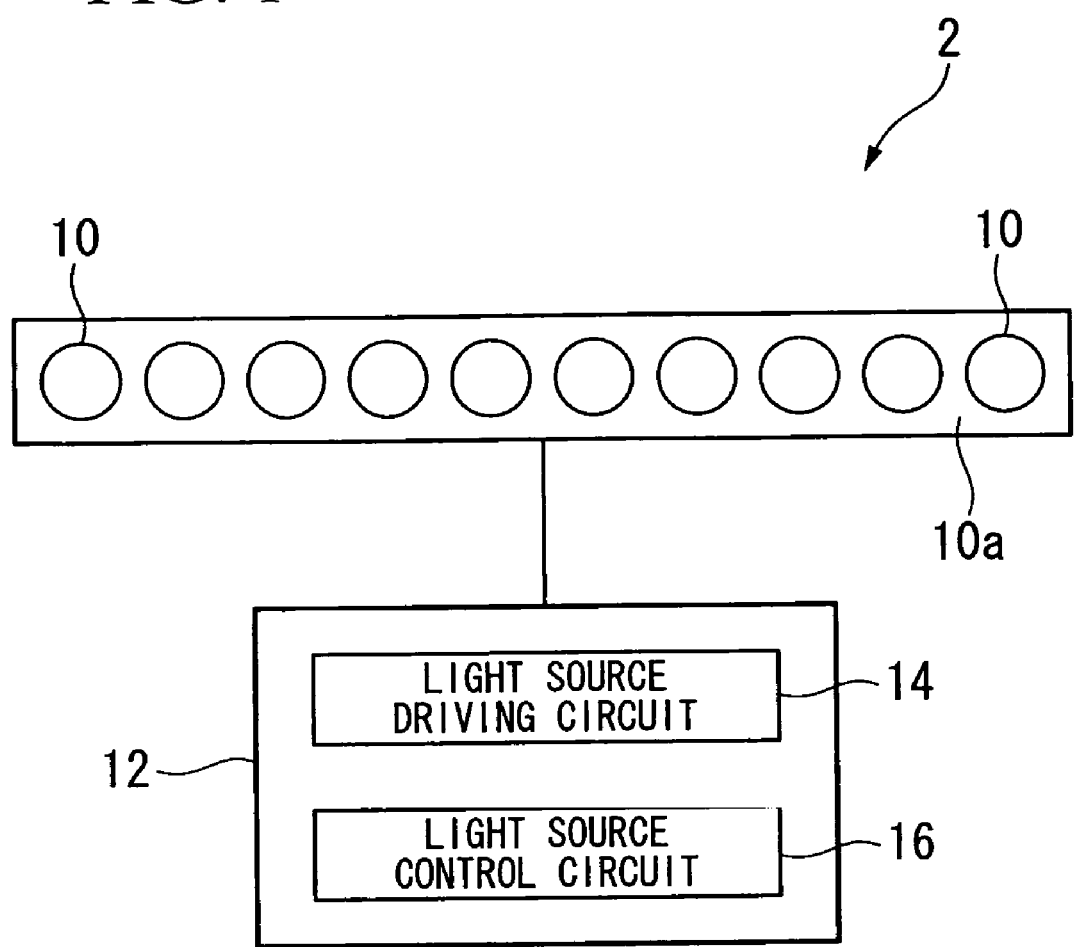
FIG. 1 is a schematic block diagram of a laser light source device of a first embodiment of the invention.

FIG. 1 is a schematic block diagram of the laser light source device of the first embodiment of the invention.

The laser light source device 2 of this embodiment includes a plurality of laser light sources 10 that emit laser lights (the number of the laser light sources 10 is ten in this embodiment) and a light source driving section 12 that drives the laser light sources 10.

The laser light sources 10 are configured in an array, and formed on, for example, an identical substrate.

Specifically, a direction in which light is resonated of each laser light source 10 is orthogonal to a substrate face 10a. The laser light source 10 is referred to as a VCSEL (Vertical-Cavity Surface-Emitting Laser) type in which laser light is emitted in a direction orthogonal to the substrate face 10a, and has a one-dimensional array structure in which the laser light sources 10 (emission section) are arrayed in a line.

Therefore, it is possible to uniformize the amount of light emitted by narrowing the gaps between the mutual laser light sources.

Furthermore, the distance between adjacent laser light sources 10 is constant.

In addition, the laser light sources 10 are not limited to a plurality of emission sections formed on an identical substrate. As the laser light sources 10, laser light sources that have been individually formed are arrayed on a support substrate by, for example, packaging may be adopted.

Furthermore, the laser light sources 10 are connected with a light source driving section 12.

In this embodiment, the light source driving section 12 drives all of the ten laser light sources 10 by a first electric current value (first driving value) or by a second electric current value (second driving value).

The light source driving section 12 includes a light source driving circuit 14 and a light source control circuit 16.

The light source driving circuit 14 drives the laser light sources 10 by selectively supplying a predetermined driving electric current to the laser light sources 10.

The light source control circuit 16 varies the electric current value that is supplied to each laser light source 10 by the light source driving circuit 14, thereby controlling the amount of laser light that is emitted from the laser light sources 10.

As described for a specific example below, some of the ten laser light sources are set to a small electric current value and the laser light is not emitted, the other of the ten laser light sources is set to a great electric current value, and the laser light is emitted. Therefore, the number of laser light sources that are turned on and the number of laser light sources that are turned off are optionally varied so that the total amount of light emitted is controlled.

Figure 2:
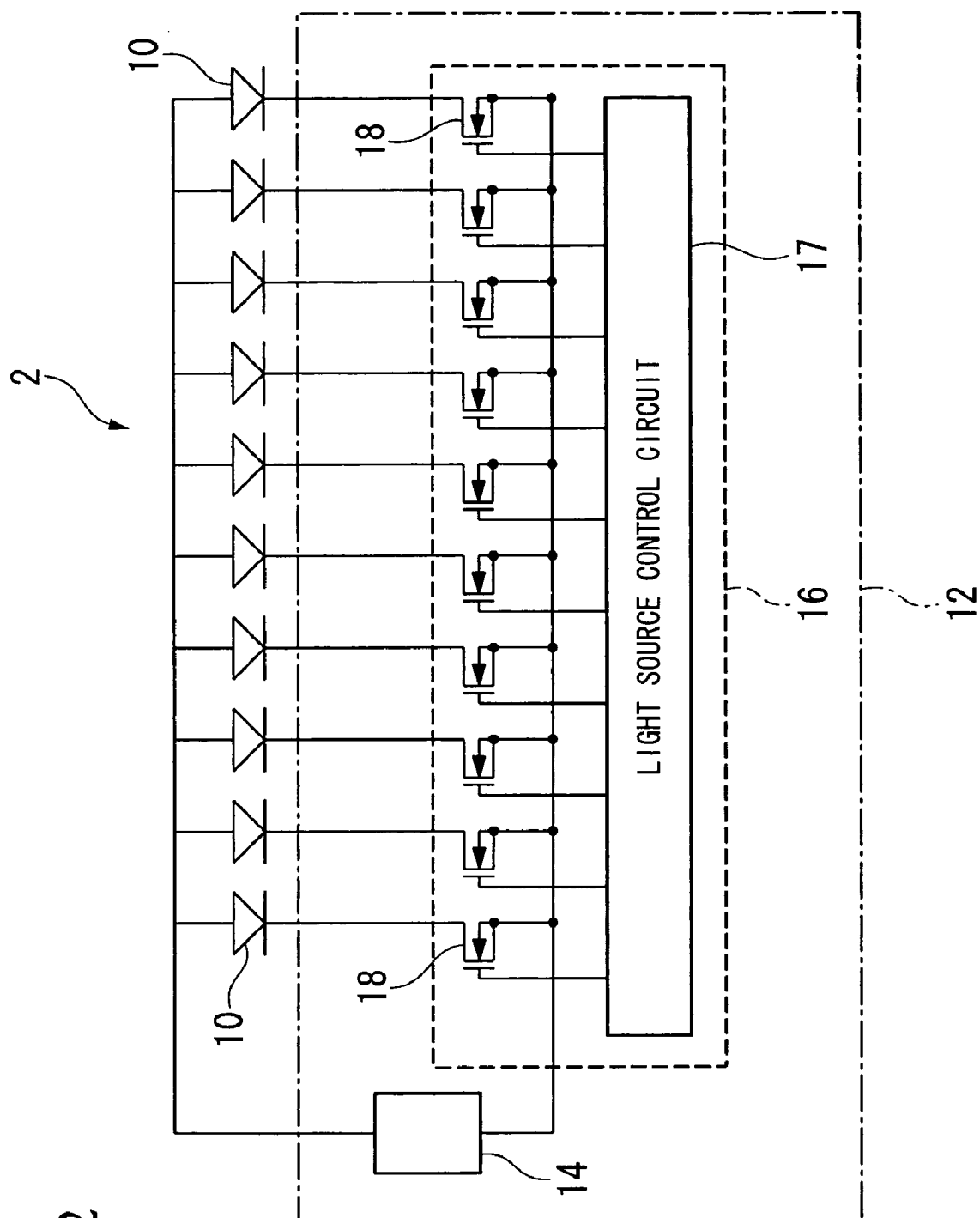
FIG. 2 is an equivalent circuit diagram of the laser light source device of the first embodiment of the invention.

FIG. 2 is an equivalent circuit diagram of the laser light source device of the first embodiment of the invention.

The light source driving circuit 14 converts the voltage of a commercial electric source (e.g., AC100V) into DC, supplies the DC voltage to the laser light sources 10, and thereby drives laser light sources 10 by the first electric current value or the second electric current value.

The light source driving circuit 14 is, for example, a switching-regulator type electric source.

Setting of the first and second electric current values of the light source driving circuit 14 is based on an electric current level for adjustment which is output from the light source control circuit 16.

A threshold level of the laser light source 10 is explained with reference to FIGS. 4A and 4B.

Figure 4A:
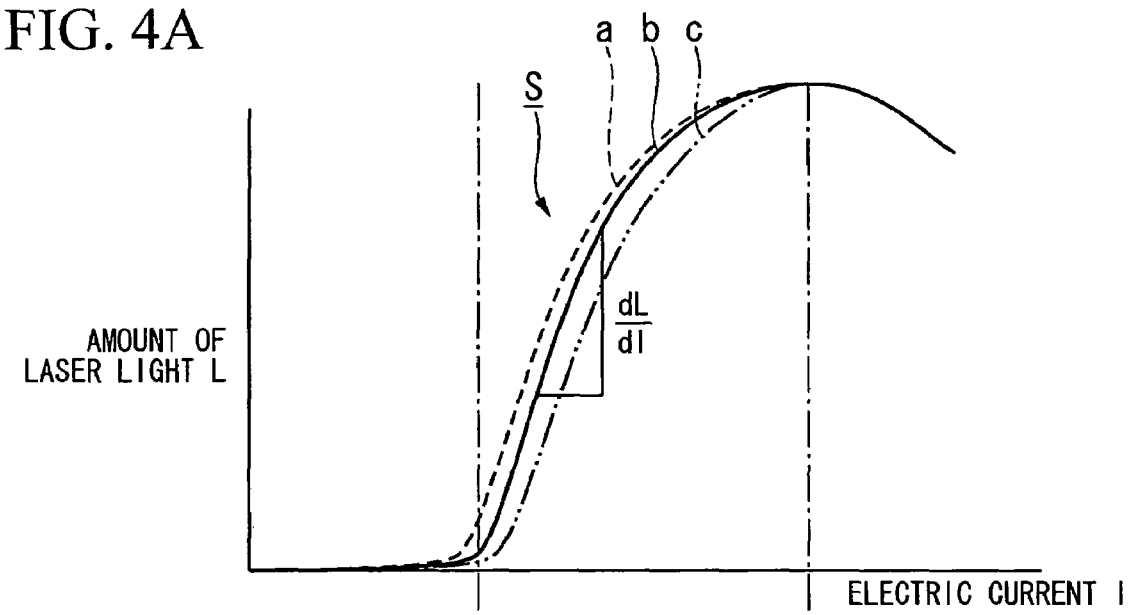
FIGS. 4A and 4B are views illustrating an output characteristic curve of a general laser light source and providing an explanation of the threshold level.

FIG. 4A illustrates the relationship between the electric current supplied to one laser light source 10 and the amount of laser light, that is a so-called output characteristic curve, the axis of abscissa represents electric current I (non-unit), and the axis of ordinate represents the amount of light emitted L (non-unit).

When increasing the electric current from zero to some degree, emission of light is not started. However, when the electric current passes a value, emission of light starts. Thereafter, a region S (referred to as a transitional region), at which the amount of light emitted increases depending on the electric current, is maintained awhile. When the electric current reaches a value, the amount of light emitted is maximized. Thereafter, the amount of light emitted decreases even if the electric current increases.

The laser light source 10 generally has the above-described output characteristic.

Figure 4B:
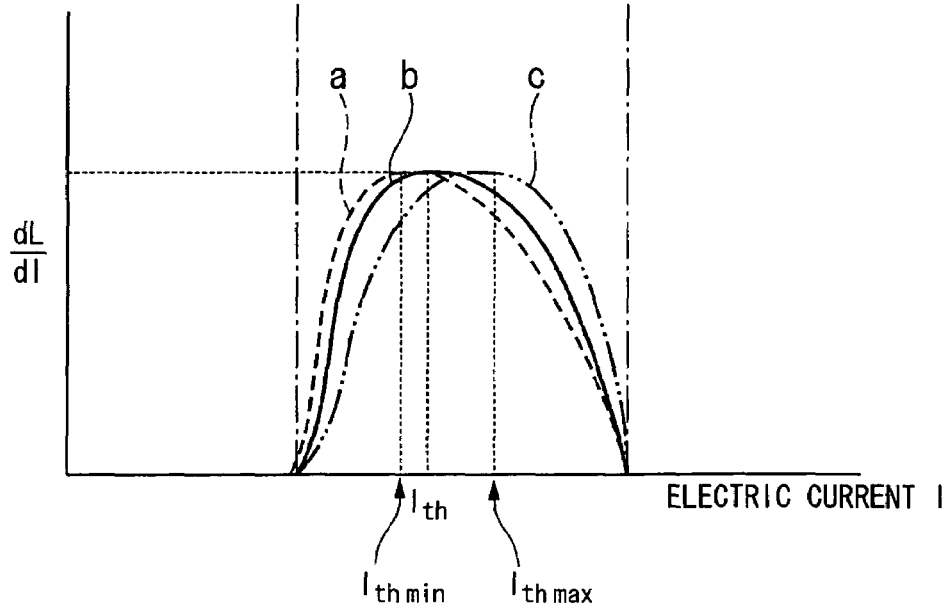

FIG. 4B illustrates the relationship between electric current I (non-unit) as the axis of abscissa and a value represented by the amount of light emitted divided by the electric current (dL/dI, non-unit) as the axis of ordinate.

In this embodiment, when the value represented by the amount of light emitted divided by the electric current is maximized (i.e., when the gradient of output characteristic curve is a maximum value), the electric current value is defined as the "threshold level".

In this embodiment, as shown in each of curves a, b, and c of FIGS. 4A and 4B, even if the threshold level $I_{th}$ varies every laser light source 10, a first driving value is set to a value less than the threshold level $I_{th\ min}$ that is the minimum value in the laser light sources 10, and a second driving value is set to a value greater than the threshold level $I_{th\ max}$ that is the maximum value in the laser light sources 10.

This is because in particular, the influences of the individual differences remarkably occur in the vicinity of threshold level of laser light in the transitional region, and even if the same electric current is input to the laser light sources, a great difference of output between every laser light source occurs.

In contrast, in this embodiment, since the first electric current value and the second electric current value are set by the above-described manner, it is possible to reliably control the total output (total amount of light emitted) while reducing the adverse effects caused by the individual differences between the laser light sources.

That is, the first and second electric current values are set to the values that are different from the threshold level of laser light at which the great influence of the individual differences in the laser light sources occurs, the number of light sources that are driven by the first and second electric current values that are different from the threshold level are controlled, and it is thereby possible to reliably control the output.

The most preferable case is that, the first electric current value is set to the electric current value that make all of the laser light sources 10 be in a state where laser light is not emitted (OFF state), and the second electric current value is set to the electric current value that make all of the laser light sources 10 be in a state where laser light is emitted (ON state).

Figure 6:
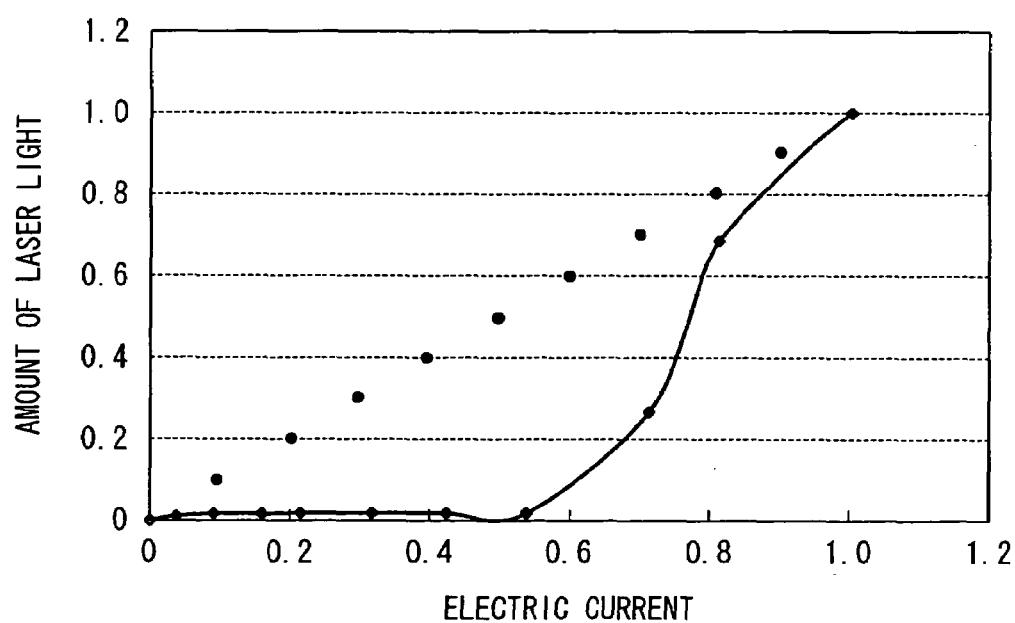
FIG. 6 is a view illustrating the relationship between electric power consumption of the laser light source and output.

For example, the first electric current value is zero, and the second electric current value is the value that can cause the laser light source 10 to emit light with the highest level of efficiency (that is, the electric current value is generated when the output is "1" and when electric power consumption is "1" in FIG. 6).

In addition, as show in FIG. 6, the first electric current value may be the value when the electric power consumption is between a value greater than zero and approximately 0.02, and the second electric current value may be the value when the electric power consumption is between a value less than 1 and approximately 0.98.

These values are outside of the threshold level of a laser light, and are the values by which operation with a high level of efficiency is stabilized.

As shown in FIG. 2, the light source control circuit 16 includes a plurality of switching circuits 18.

One switching circuit 18 is connected in series with one laser light source 10.

The switching circuit 18 is the element that causes the driving electric current that is supplied from the light source driving circuit 14 to the laser light source 10 to turn on or off.

Specifically, when the switching circuit 18 is turned on, forward electric current flows to the laser light source 10 that is connected to the switching circuit 18, and the laser light source 10 continues to be lit.

In contrast, when the switching circuit 18 is turned off, the electric current does not flow in the forward direction.

After turning the laser light source 10 off, when the switching circuit 18 is turned on, the electric current flows in the forward direction, and the laser light source 10 is lit again.

That is, by turning the switching circuit 18 on or off, the laser light source 10 is controlled to be lit or not.

As the switching circuit 18, a three-terminal element such as a transistor that is the semiconductor element operating the switching, may be used.

Furthermore, a switch control circuit 17 is provided to the light source control circuit 16. The switch control circuit 17 controls (switches) so that each of the switching circuits 18 is turned on or off.

Specifically, when the switching circuit 18 is constituted by, for example, a three-terminal element, the switch control circuit 17 controls the voltage that is supplied to a gate terminal of a transistor of each switching circuit 18.

The light source control circuit 16 controls the amount of laser light that is emitted from the laser light sources 10 by varying the number of laser light sources 10 that are driven by the first electric current value or the second electric current value of the light source driving circuit 14.

Alternatively, the light source control circuit 16 controls the amount of laser light that is emitted from the laser light sources 10, by varying each of the number of laser light sources 10 that are driven by the first electric current value of the light source driving circuit 14 and the number of laser light sources 10 that are driven by the second electric current value of the light source driving circuit 14.

In other words, the light source control circuit 16 controls the amount of laser light that is emitted from the laser light sources 10, by adjusting the number of laser light sources 10 that are driven by the first electric current value of the light source driving circuit 14 and the number of laser light sources 10 that are driven by the second electric current value of the light source driving circuit 14.

When the amount of light emitted by the laser light sources 10 decreases because of an image, the light source control circuit 16 controls the amount of laser light emitted by the number of the laser light sources 10 lit.

The light source control circuit 16 controls the switching circuit 18 to be turned on or off, and thereby adjusts the amount of light emitted.

When the light source control circuit 16 controls the switching circuit 18 to be turned on, the laser light source 10 is driven by the second electric current value (e.g., the state where the laser light source 10 is lit with the maximum amount of light).

Also, when the light source control circuit 16 controls the switching circuit 18 to be turned off, the laser light source 10 is driven by the first electric current value (e.g., the state where the laser light source 10 is not lit).

Each laser light source 10 is independent, and it is thereby possible to independently cause the amount of light emitted to be turned on or off.

For example, as shown in FIG. 2, when a 100% of the amount of light is obtained by lighting all of the ten laser light sources 10 by the second electric current value, and when the maximum amount of light emitted by the ten laser light sources 10 is equal, it is possible to obtain a 50% of the total amount of light emitted by lighting five of the laser light sources 10, even if the threshold levels are varied.

This is because, the light source control circuit 16 controls five of the switching circuits 18 so as to turn on so that the laser light sources 10 corresponding to the switching circuits 18 are thereby driven by the second electric current value and are lit, and the remaining laser light sources 10 corresponding to the switching circuits 18 that are controlled so as to turn off are thereby driven by the first electric current value and are not lit.

In varying the number of laser light sources 10 that are driven by the first electric current value or the second electric current value, a combination, for example, in which the number of laser light sources 10 that are driven by the second electric current value is six and the number of laser light sources 10 that are driven by the first electric current value is four, or a combination in which the number of laser light sources 10 that are driven by the second electric current value is four and the number of laser light sources 10 that are driven by the first electric current value is six, can be obtained.

The light source control circuit 16 is preferably constituted by a logical sequence integrated circuit. However, instead of the integrated circuit, the light source control circuit 16 may be controlled by a micro computer.

Figure 3:
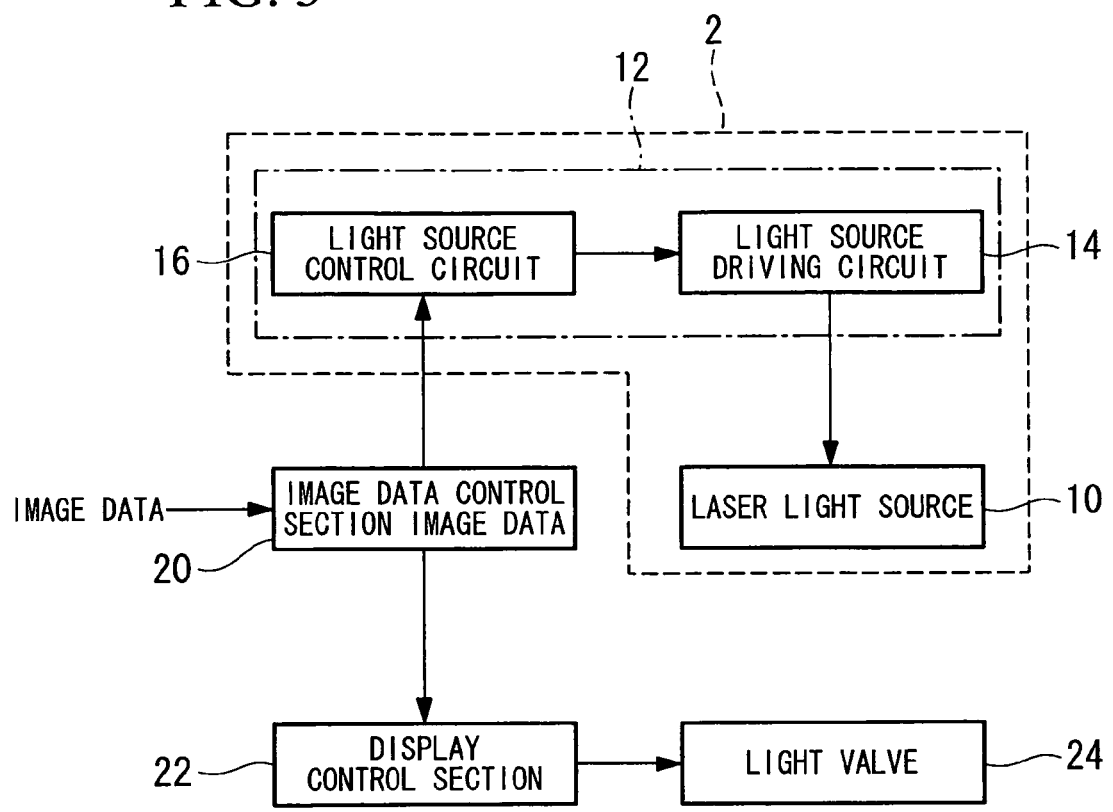
FIG. 3 is a schematic block diagram illustrating a driving method for driving the laser light source device of the first embodiment of the invention.

FIG. 3 is a schematic block diagram illustrating a driving method for driving the laser light source device of the first embodiment of the invention.

Here, a schematic operation of a projector including the laser light source device is also explained.

An image data that is output from an external device (a reproducer such as a video cassette recorder, a DVD player, or the like, or a personal computer) is analyzed by an image data control section 20, the image data control section 20 transmits the output of a light source that is necessarily to the light source control circuit 16 of the laser light source device 2, based on the maximum luminance for displaying.

At this time, the image data control section 20 transmits the image data to the display control section 22.

Next, the light source control circuit 16 of the laser light source device 2 drives the laser light sources 10 by the light source driving circuit 14 so as to obtain the necessary amount of light emitted, and illuminates a light valve 24 with laser light.

Specifically, in a step for driving a light source at which the laser light sources 10 that emit laser light is driven by the first electric current value or the second electric current value, by varying each of the number of laser light sources 10 that are driven by the first electric current value of the light source driving circuit 14 and the number of laser light sources 10 that are driven by the second electric current value of the light source driving circuit 14, the amount of laser light that is emitted from the laser light sources 10 is controlled.

In addition, the first driving value is the value of a laser light source 10 that is less than the threshold level, and the second driving value is a value of a laser light source 10 that is greater than the threshold level.

When an electric source is supplied to the laser light source device 2, the light source control circuit 16 controls supplying driving electric current to the laser light source 10 from the light source driving circuit 14.

The laser light source 10 is thereby caused to light (emission) and emit laser light.

For example, as shown in FIG. 2, the method for driving the laser light source device can obtain 10% of the total amount of light emitted when one laser light source 10 is turned on by the switching circuit 18. 20% of the total amount of light emitted can be obtained when two laser light sources 10 are turned on by the switching circuits 18.

In a similar manner, 30%, 40%, and up to 100% of the total amount of light emitted can be obtained.

Figure 5:
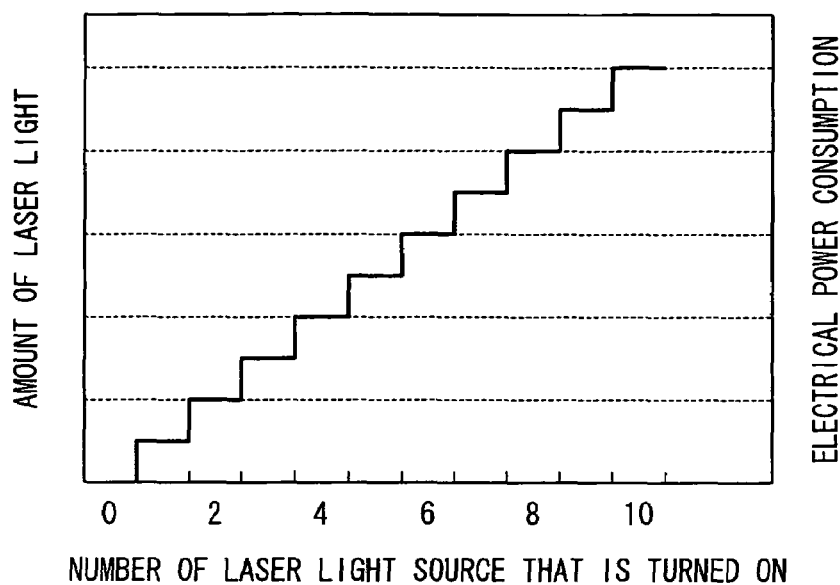
FIG. 5 is a view illustrating the relationship among output, electric power consumption, and the number of laser light sources in the first embodiment of the invention.

FIG. 5 illustrates the relationship between output, electric power consumption, and the number of laser light sources in the first embodiment of the invention.

The axis of abscissa represents the number of laser light sources that are turned on, and the axis of ordinate represents output (amount of light emitted) and electric power consumption.

The output and the electric power consumption increase depending on an increase in the number of the laser light sources 10 that are lit by the second electric current value.

FIG. 6 illustrates the relationship between the electric current supplied to the laser light source and the amount of laser light.

FIG. 6 indicates a transition (output characteristic curve) in the amount of light emitted (output) when varying the electric current supplied to a general laser light source.

The axis of abscissa represents the electric current supply, and the axis of ordinate represents the amount of light emitted.

In FIG. 6, the electric current supply value is normalized so that the electric current supply is "1" when the maximum amount of light emitted is "1".

In a laser light source, since there is a threshold level (a value at which the amount of light emitted is steeply increased) of a laser light, output is sharply started and raised when passing a constant electric current.

The relationship between the amount of light emitted and the electric current supply does not form a linear line.

Therefore, the amount of light does not always increase when the electric current supply increases. Conversely, the amount of light does not always decrease when the electric current supply decreases.

In addition, the curve shown in FIG. 6 indicates an output characteristic curve of one laser light source. When a plurality of laser light sources is synthesized, characteristics similar to the above may also be obtained.

Figure 7:
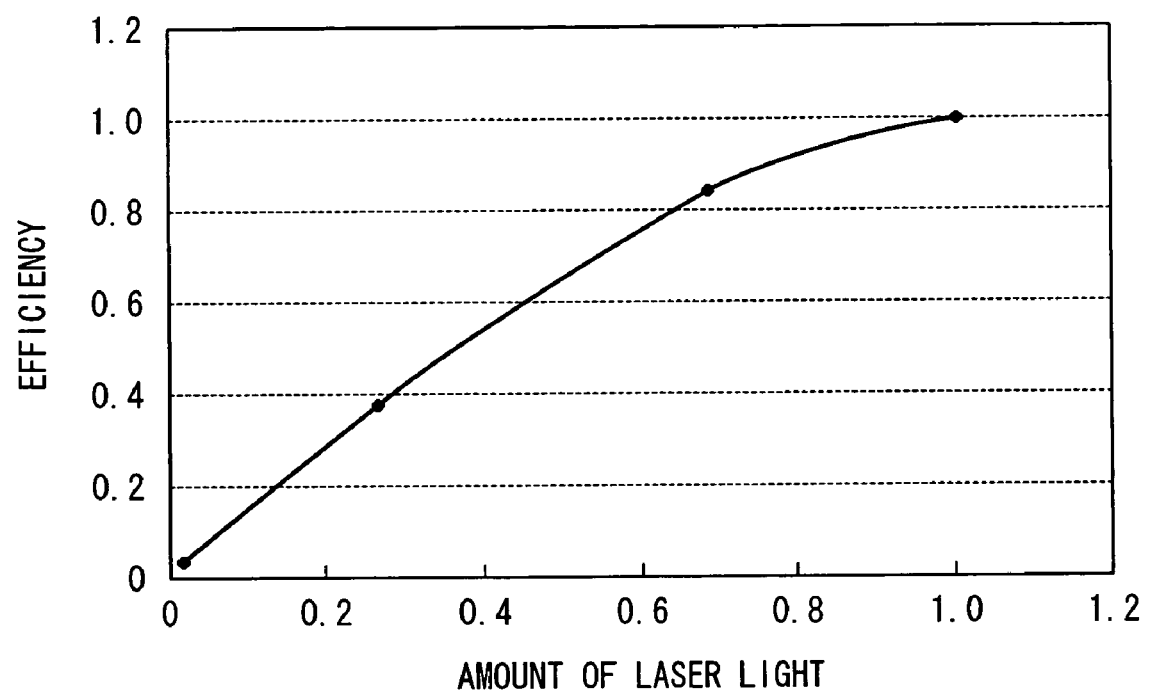
FIG. 7 is a view illustrating the relationship between efficiency of the laser light source and output.

FIG. 7 illustrates the relationship between the efficiency of the laser light source and the amount of light emitted.

FIG. 7 illustrates efficiency relative to the amount of light emitted from a general laser light source.

The axis of abscissa represents the amount of light emitted, and the axis of ordinate represents efficiency.

The "efficiency" is the amount of light divided by the electric current supply, and indicates how much of the electric current supply is necessary in order to obtain the amount of light emitted.

When controlling the amount of light emitted by varying the continuous electric current, the efficiency of the laser light source is low.

In the area at which the amount of light emitted is close to the value "1", though the efficiency can be maintained to be close to the value "1", specifically, the efficiency is low when the output is low.

Returning to FIG. 6, the output characteristic curve that is indicated by a solid line means the relationship between the total electric current supply and the total amount of light emitted while continuously varying the electric current supply of each of the laser light sources. In contrast, discrete plot points indicate the relationship between the total electric current supply and the total amount of light emitted, when the driving method of this embodiment is applied in which all of the ten laser light sources are driven by the first electric current value or the second electric current value.

For example, In the case of obtaining 0.6 (60%) of the total amount of light emitted relative to maximum amount of light "1", when the method of continuously varying the electric current supply of each of the laser light sources is used, 0.8 (80%) of the total amount of electric current supply is necessary, and the efficiency is thereby low.

In contrast, when the driving method of this embodiment is used, in order to obtain 0.6 (60%) of the total amount of light emitted, it is sufficient that the necessary electric current supply is 0.6 (60%) of the total amount of electric current supply, and the efficiency is thereby improved.

That is, in the driving method of this embodiment, in order to obtain 0.6 (60%) of the total amount of light emitted, it is sufficient that six of the laser light sources are lit by the maximum amount of light emitted and four of the laser light sources are not lit.

When the laser light source is lit by the maximum amount of light emitted, maximum efficiency is obtained in the laser light source. Therefore, in terms of the overall efficiency of the ten laser light sources, the efficiency is also improved, compared with the method of continuously varying the electric current supply of each of the laser light sources.

According to this embodiment, by varying each of the number of laser light sources that are driven by the first electric current value or the second electric current value in the laser light sources, the amount of laser light that is emitted from the laser light sources is controlled. The first electric current value is set to a value less than the lowest threshold level of the threshold levels of the laser light sources, and the second electric current value is set to a value greater than the highest threshold level of the threshold levels of the laser light sources.

Therefore, it is possible to provide a light source device that can reliably control the total output (total amount of light emitted), while reducing the irregularities caused by the laser light sources whose output characteristics include individual differences.

Especially, since the first and second electric current values are set to values that are different from the threshold levels of laser light sources at which the great influence of the individual differences in the laser light sources occurs, and since the number of light sources that is driven by the first and second electric current values that are different from the threshold level are controlled, it is possible to reliably control the output of a laser light source.

Furthermore, it is possible to achieve a laser light source device that can emit an illumination light with a stabilized quality of chromaticity and luminance in which individual differences are low.

Furthermore, it is possible to adapt to a manufacturing in which each laser light source having individual differences is effectively available, resource is not useless, and cost is reduced.

Modified Example

In the above embodiment as shown in the drawings, the number of laser light sources 10 is ten. However, the number is not limited to ten, and the number may be another plural number (other than the number "ten").

Furthermore, the distance between adjacent laser light sources 10 is constant. However, it is not necessary to regularly array the laser light source with a constant gap, and the gaps between some of the laser light sources may be different from each other.

Furthermore, as the laser light sources 10, each of laser light sources that emit colored light such as red, blue, or green may be used. In this case, white balance may be adjusted by varying each of the number of laser light sources 10 that are turned on or off.

In this embodiment, although the first electric current value is set to a value less than the lowest threshold level of the threshold levels of the laser light sources 10, and the second electric current value is set to a value greater than the highest threshold level of the threshold levels of the laser light sources 10, the invention is not limited thereto.

For example, laser lights are driven while a threshold level are stable, the first electric current value may be set to a value less than at least one of the threshold levels of the laser light sources 10, and the second electric current value may be set to a value greater than at least one of the threshold levels of the laser light sources 10.

In this case, effects similar to the effects of this embodiment are also obtained, compared with the case of controlling all of the laser light sources by continuous electric current values.

Second Embodiment

Next, a second embodiment of the invention will be explained.

In this embodiment, identical symbols are used for the elements which are identical to those of the above-described first embodiment, and the explanations thereof are omitted.

In addition, in this embodiment, the words "DRIVE" and "NON-DRIVE" are used as needed.

This means that the laser light source 10 is either lit or not lit by the first electric current value or the second electric current value.

Figure 8:
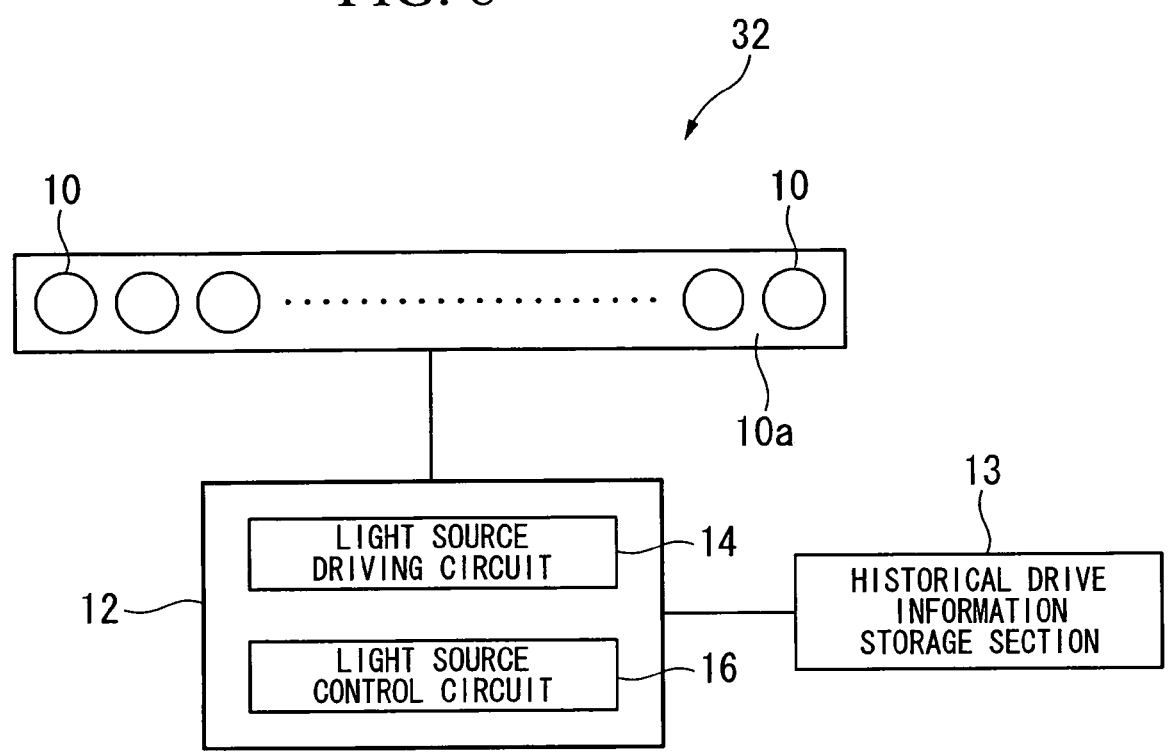
FIG. 8 is a schematic block diagram of a laser light source device of a second embodiment of the invention.

FIG. 8 is a schematic block diagram of a laser light source device of a second embodiment of the invention.

Figure 9:
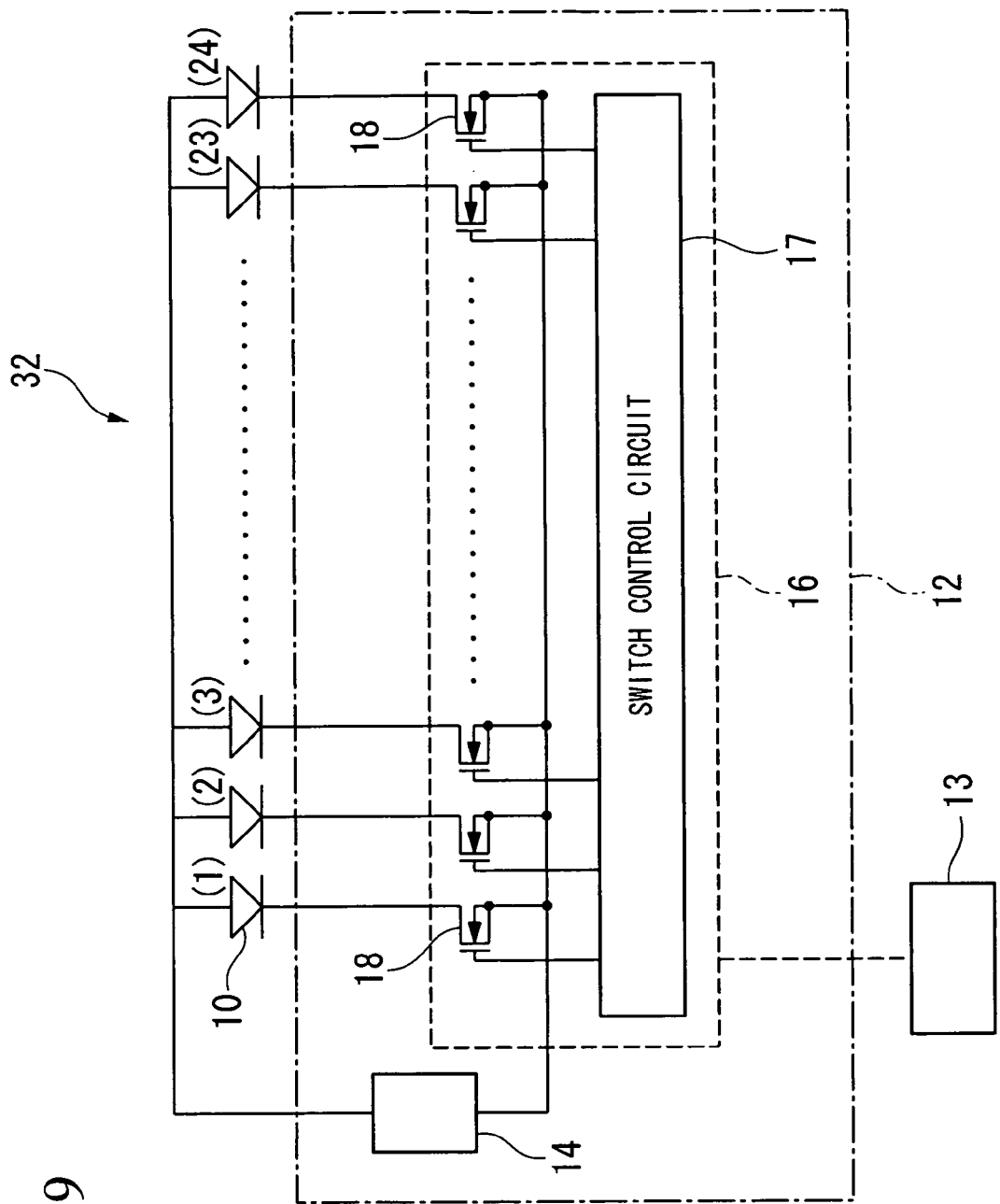
FIG. 9 is an equivalent circuit diagram of the laser light source device of the second embodiment of the invention.

FIG. 9 is an equivalent circuit diagram of the laser light source device of the second embodiment of the invention.

As shown in FIG. 8, a laser light source device 32 of this embodiment includes laser light sources 10 that emit laser light, a light source driving section 12 that drives the laser light sources 10, and a historical drive information storage section 13 (storage section).

As shown in FIG. 9, the number of the laser light sources 10 of this embodiment is twenty-four.

The laser light sources 10 are numbered as emitter numbers (1) to (24), respectively.

Furthermore, twenty-four switching circuits 18 are provided corresponding to the number of laser light sources 10.

The switching circuits 18 cause driving electric current that is supplied to each of the laser light sources 10 numbered as emitter numbers (1) to (24) from the light source driving circuit 14 to turn on or off.

The light source driving section 12 selectively drives each of laser light sources 10 numbered as emitter numbers (1) to (24) in a step for driving a light source.

Also, in the step for driving light source, drive of at least one laser light source that has been driven is stopped, and at least one laser light source that has not been driven drives.

The total amount of light generated from the laser light sources 10 is controlled.

The historical drive information storage section 13 is electrically connected with a light source control circuit 16 of the light source driving section 12.

Therefore, between the light source driving section 12 and the historical drive information storage section 13, data is input or output.

The historical drive information storage section 13 is a semiconductor chip such as an IC chip (a nonvolatile memory such a flash memory, for example), or the like.

Historical drive information with regard to each of the laser light sources 10 that are turned on or off depending on the passage of time is stored to the historical drive information storage section 13 while performing a step for storing.

Specifically, while the light source control circuit 16 controls the laser light sources 10, the information with regard to the drive of each of the laser light sources 10 is output to the historical drive information storage section 13, the historical drive information storage section 13 stores the information that is output from the light source control circuit 16 in detail.

Therefore, historical drive information with regard to the drive of each of the laser light sources 10 depending on the passage of time is stored to the historical drive information storage section 13 in time series.

The historical drive information includes previous drive information, cumulative drive information, and continuous drive information.

The previous drive information is information with regard to whether the light source driving section 12 has driven the laser light source 10 or not before driving the laser light source 10.

The cumulative drive information is information with regard to the cumulative number of driving times or the cumulative length of the driving time in each of the laser light sources 10.

The continuous drive information is information with regard to continuous driving in each of the laser light sources 10.

The driving method base on the above drive information is described below.

The light source control circuit 16 will be explained in detail.

The light source control circuit 16 not only simply selects each of the laser light sources 10, but also performs a primary selection step and a secondary selection step based on the historical drive information stored in the historical drive information storage section 13 or based on random numbers generated by the light source control circuit 16 in a computing process.

In the primary selection step, each of the laser light sources 10 is selected based on one of the previous drive information, the cumulative drive information, and the continuous drive information.

In the secondary selection step, the laser light source 10 is randomly selected from the laser light sources 10 that have been selected in the primary selection step.

The laser light source 10 that is selected in the secondary selection step is driven or not driven.

In addition, in the secondary selection step for randomly selecting the laser light source 10, the laser light source 10 may be selected based not on the historical drive information, based only on the random number generated in the computing process.

Also, the laser light source 10 may be selected based both on the random number generated in the computing process and the historical drive information.

In addition, in the second embodiment of the invention, the historical drive information storage section 13 is disposed outside of a light source driving section 12. However, the historical drive information storage section 13 may be included in the light source driving section 12.

In addition, the historical drive information storage section 13 may be a memory (buffer) provided in the light source control circuit 16.

Also, the historical drive information storage section 13 may be divided depending on the capacity in which information can be stored, or on the kinds of information.

For example, since the amount of information about whether the laser light source 10 has been driven or not is comparatively low, the information may be stored in the memory of the light source control circuit 16.

In addition, since cumulative information such as the number of driving times, the length of the driving time, or the like, in which the laser light source 10 has been driven for a long time, is comparatively large, the information may be stored to a storage device separated from the light source control circuit 16.

In addition, the light source control circuit 16 may perform a step of selecting drive information that selects one of the previous drive information, the cumulative drive information, and the continuous drive information, before performing the primary selection step.

In this case, the primary selection step is performed based on the drive information selected by the step for selecting drive information.

Next, the method for driving the laser light source 10 by the light source driving section 12 based on the historical drive information stored in the historical drive information storage section 13 will be explained with reference to FIG. 10.

Figure 10:
FIG. 10 is a timing diagram illustrating a driving method for driving the laser light source device of the second embodiment of the invention.

FIG. 10 is a timing diagram illustrating the method for driving the laser light source device 32.

Specifically, FIG. 10 is the timing diagram that indicates the total amount of light driven by the laser light sources and a drive condition indicating whether each of the emitter numbers (1) to (24) is driven or not, while time passes (axis of abscissa).

In addition, in FIG. 10, a step number sequentially increases depending on the passage of time, and the drive condition of emitter numbers (1) to (24) in each step.

In FIG. 10, the lattices that are colored mean "DRIVE", and the lattices that are not colored, (i.e., white lattices) mean "NON-DRIVE".

As described above, in the laser light source device 32, the step number increases depending on the passage of time, the total number of laser light sources that are driven is set in every step, a laser light source is selected from the emitter numbers (1) to (24) depending on the total number of laser light sources, and the laser light source that is selected is driven.

In addition, in the laser light source device 32, the light source control circuit 16 of the light source driving section 12 selectively drives each of the laser light sources 10 based on the historical drive information stored in the historical drive information storage section 13, that is, the previous drive information, the cumulative drive information, and the continuous drive information.

Next, the case of driving the laser light sources 10 based on each information will be explained.

Driving Method Based on Previous Drive Information

The driving method based on the previous drive information is the method in which the light source driving section 12 selects a laser light source from the emitter numbers (1) to (24) based on the information with regard to whether the laser light source 10 has been driven or not before driving the laser light source 10, and drives the laser light source 10.

At first, in the step S1 in which the total number of the laser light sources that are driven is twenty-four, all of the laser light sources of the emitter numbers (1) to (24) are driven.

Next, in the step S2 in which the total number of the laser light sources that are driven is twenty-three, the laser light source of only the emitter number (1) is set to "NON-DRIVE" and the emitter numbers (2) to (24) are set to "DRIVE".

Next, in the step S3 in which the total number of the laser light sources that are driven is twenty, the laser light source of emitter number (1) that has been set to "NON-DRIVE" in the previous step is set to "DRIVE", and the laser light sources of emitter numbers (2) to (5) that have been set to "DRIVE" in the previous step is set to "NON-DRIVE".

In addition, the "DRIVE" of laser light sources of the emitter numbers (6) to (24) is maintained.

Next, in the step S4 in which the total number of the laser light sources that are driven is ten, the laser light sources of emitter numbers (2) to (5) that have been set to "NON-DRIVE" in the previous step is set to "DRIVE", and the laser light sources of emitter numbers (6) to (15) that have been set to "DRIVE" in the previous step is set to "NON-DRIVE".

In addition, the laser light sources of emitter numbers (21) to (24) are fleshly set to "NON-DRIVE".

In addition, the "DRIVE" of laser light sources of the emitter numbers (1) and (16) to (20) is maintained.

Next, in the step S5 in which the total number of the laser light sources that are driven is the same as the step S4, the laser light sources of emitter numbers (6) to (11) and (21) to (24) that has been set to "NON-DRIVE" in the previous step is set to "DRIVE", and the laser light sources of emitter numbers (1) to (5) and (16) to (20) that have been set to "DRIVE" in the previous step is set to "NON-DRIVE".

In addition, the "NON-DRIVE" of laser light sources of the emitter numbers (12) to (15) is maintained.

In the above-described step for driving, the drive of the laser light source that has been driven is stopped and the laser light source that has not been driven is driven, based on the previous drive information.

In other words, the drive of the laser light source that has been driven in a first step (the previous step) is stopped in a second step after the first step, and the laser light source that has not been driven in the first step is driven in the second step.

Therefore, continuous drive of a laser light source is prevented in each of the laser light sources, and continuous stopping of the drive of laser light source is prevented in each of the laser light sources.

Therefore, it is possible to selectively drive the laser light source in the laser light sources so that a specific laser light source is not continually driven or so that a specific laser light source is not driven.

Thus, the amount of light emitted from the light source devices is controlled so that the frequency of the driving of the laser light sources is equalized.

As a result, the number of driving times or the length of the driving time of the laser light sources is uniformed, and it is possible to prevent the occurrence of individual differences with regard to the lengths of time during which the laser light sources emit light.

Driving Method Based on Cumulative Drive Information

The driving method based on the cumulative drive information is the method in which a laser light source is selected from the emitter numbers (1) to (24) based on the information with regard to the cumulative number of driving times or the cumulative length of the driving time of each laser light source, and the selected laser light source is driven.

For example, at the time when the step S6 in which all of the laser light sources are driven is completed, when referring to cumulative number of driving times of each of emitter numbers (1) to (24), the cumulative number of driving times of the laser light source of emitter numbers (1) to (5) and (12) to (15) is four. In contrast, the cumulative number of driving times of the laser light source of emitter numbers (6) to (11) and (16) to (24) is five.

That is, the number of the laser light sources whose cumulative number of driving times is five is fifteen.

As described above, the laser light source whose number of driving times or whose length of driving time is relatively greater than that of the laser light sources and the laser light source whose number of driving times or whose length of driving time is relatively less than that of the laser light sources are found.

Next, in the step S7 in which the total number of the laser light sources that are driven is twenty, the emitter numbers (10), (11), (19), and (20) are selected from the laser light source whose cumulative number of driving times is five and are set to "NON-DRIVE".

In other words, by the above described secondary selection step, the four laser light sources are selected from the fifteen laser light sources whose cumulative number of driving times is five, the four laser light sources are set to "NON-DRIVE".

Furthermore, in other words, the emitter numbers (6) to (9), (16) to (18), and (21) to (24) are continuously set to "DRIVE" in the step S7.

In addition, in the step S7, the laser light source whose cumulative number of driving times is four is set to "DRIVE".

In addition, the emitter numbers (6) to (9), (16) to (18), and (21) to (24) whose cumulative number of driving times is five and that are not selected in the secondary selection step, is stored in the historical drive information storage section 13.

The light source control circuit 16 causes the laser light source whose cumulative number of driving times is great to be preferentially set to "NON-DRIVE" in a later step.

For example, the light source control circuit 16 causes the emitter numbers (21) to (24) whose cumulative number of driving times is great to be set to "NON-DRIVE" in the step S8.

In the above-described driving method, the laser light source whose number of driving times or whose length of driving time is relatively greater than that of the laser light sources is not driven, and the laser light source whose number of driving times or whose length of driving time is relatively less than that of the laser light sources is driven, based on the cumulative drive information.

Therefore, the drive of laser light source whose number of driving times or whose length of driving time is relatively greater is prevented, and stopping of the drive of laser light source whose number of driving times or whose length of driving time is relatively smaller is prevented.

Furthermore, effects similar to the effects of the above-described driving method are obtained.

Driving Method Based on Continuous Drive Information

The driving method based on the continuous drive information is the method in which a laser light source is selected from the emitter numbers (1) to (24) based on the information with regard to the continuous drive of each of the laser light sources, and the selected laser light source is driven.

The step S8 in which the total number of the laser light sources that are driven is twenty, the step S9 in which the total number of the laser light sources that are driven is fifteen, and the step S10 in which the total number of the laser light sources that are driven is sixteen are sequentially performed.

When referring to the continuous number of driving times of each of emitter numbers (1) to (24), the laser light sources of emitter numbers (1) and (18) are sequentially driven in the step S6 to S10, and the continuous number of driving times is five. That is, the continuous number of driving time is greatest in the laser light sources.

Next, in the step S11 in which the total number of the laser light sources that are driven is ten, the laser light sources of emitter numbers (1) and (18) whose continuous number of driving times is greatest are set to "NON-DRIVE", and a laser light source whose continuous number of driving times is small is set to "DRIVE".

In the above-described driving step, the laser light source whose continuous number of driving times or whose continuous length of driving time is relatively greater than that of the laser light sources is not driven, and the laser light source whose continuous number of driving times or whose continuous length of driving time is relatively less than that of the laser light sources is driven, based on the continuous drive information.

Therefore, the drive of the laser light source whose continuous number of driving times or whose continuous length of driving time is relatively greater is prevented, and the stopping of the drive of laser light source whose continuous number of driving times or whose continuous length of driving time is relatively smaller is prevented.

Furthermore, effects similar to the effects of the above-described driving method are obtained.

As described above, by driving the light sources based on the historical drive information including the previous drive information, the cumulative drive information, and the continuous drive information, and by performing the primary selection step and the secondary selection step, it is possible to control the amount of light emitted from the light source device 32 while equalizing the frequency of the driving of the laser light sources 10.

Therefore, the number of driving times or the length of the driving time of the laser light sources is uniformed, and it is possible to prevent the occurrence of individual differences with regard to the lengths of time during which the laser light sources emit light.

Thus, it is possible to extend the average length of time the laser light source emits light.

In addition, in this embodiment, the method for driving laser light sources based on the previous drive information, the cumulative drive information, and the continuous drive information, and the method due to the primary selection step and the secondary selection step are described. However, the invention is not limited to this embodiment.

For example, by shifting the emitter number, that is, by using a program that adds integer to emitter number, the laser light source of the added emitter number may be selected and driven.

In addition, by combining the above-described driving methods, the driving of the laser light sources may be controlled.

In addition, one of the above-described driving methods may be preferentially performed.

In addition, a plurality of look-up-tables in which "total number of driving laser light sources", "emitter number", and "step number" have been determined is stored in the historical drive information storage section 13 in advance, the light source control circuit 16 read out the specified look-up-table from the historical drive information storage section 13, and the laser light sources may be driven based on the look-up-table that has been read out.

Also, in the above-described case, the frequency of the driving of the laser light sources is equalized, the amount of light emitted from the light source devices is controlled, and effects similar to the above-described effects are obtained.

In addition, the time of performing each of the steps S1 to S16 in FIG. 10, that is, the length of time maintaining the drive condition or the length of time of maintaining the non-drive condition of each laser light source 10 corresponds to, for example, one frame period (1/60 second).

In addition, the time of performing each of the steps S1 to S16 is not limited to the above case, and the time is adequately set.

Third Embodiment

Figure 11:
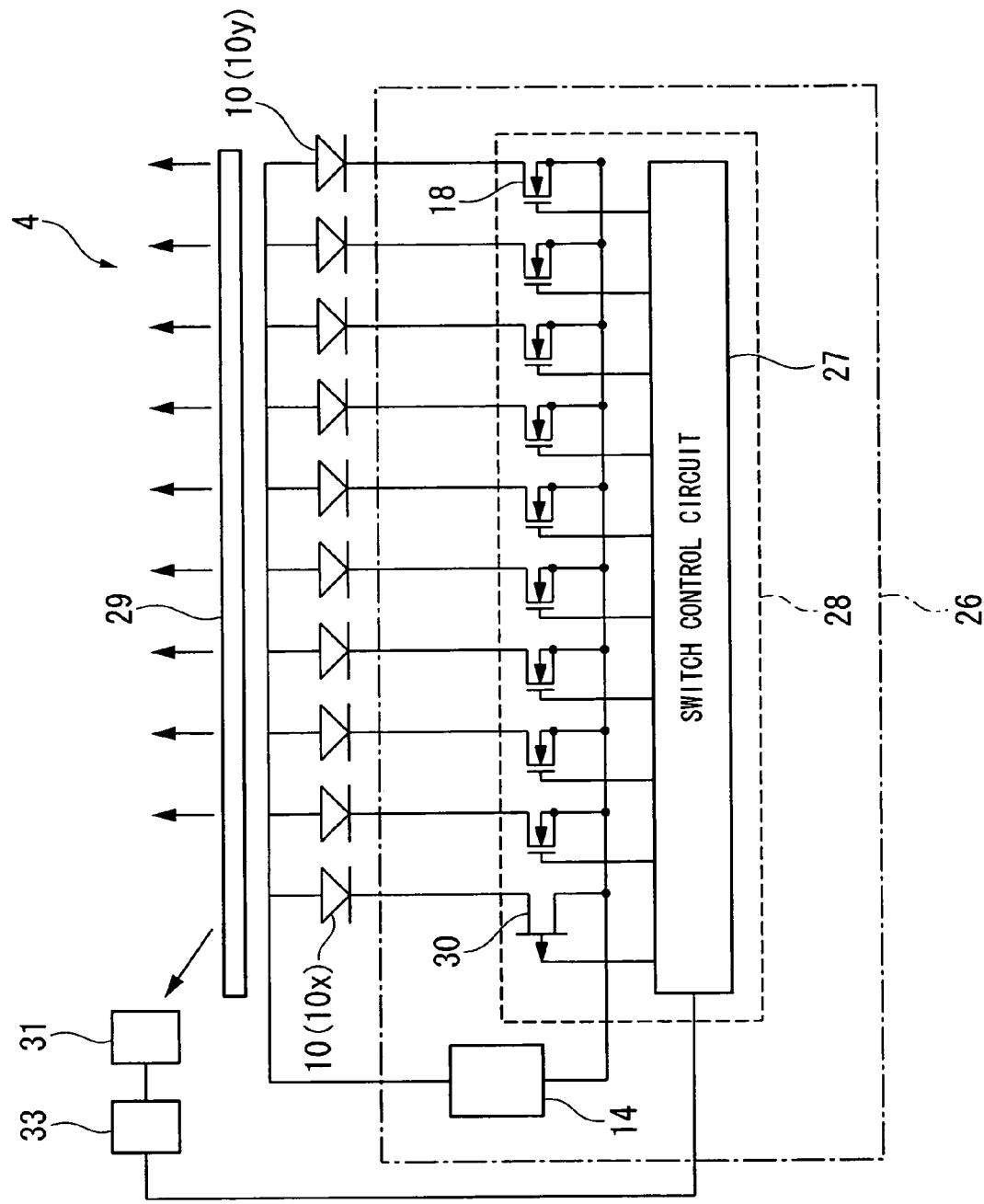
FIG. 11 is a schematic block diagram of a laser light source device of a third embodiment of the invention.

FIG. 11 is a schematic block diagram of a laser light source device of a third embodiment of the invention.

The laser light source device 4 of this embodiment includes the laser light source 10, a light source driving section 26, a hologram element 29 (optical element), a photodiode 31 (light amount detection section), and an I/V conversion section 33 (light amount detection section) 33.

The light source driving section 26 includes a light source control circuit 28, the light source driving circuit 14, and a switch control circuit 27.

Furthermore, the light source driving section 26 controls at least one light-amount-adjusting laser light source 10x (second laser light source) (the number of light-amount-adjusting laser light source 10x is one in this embodiment) by a continuous electric current value, and drives the remaining laser light sources 10 (first laser light source) (the number of laser light sources 10 is nine in this embodiment) by the first electric current value or the second electric current value.

The hologram element 29 is a computer generated hologram (hereinafter referred to as CGH).

The light emitted from all of the nine laser light sources 10 and one light-amount-adjusting laser light source 10x is incident into the hologram element 29.

The hologram element 29 leads the amount of light emitted from the light-amount-adjusting laser light source 10x to the photodiode 31.

In other words, the hologram element 29 separately disperses the light emitted from all of nine laser light sources 10 and one light-amount-adjusting laser light source 10x, and leads only the amount of light emitted from the light-amount-adjusting laser light source 10x to the photodiode 31.

In addition, it is sufficient that the hologram element 29 separately disperses a part of the light emitted from the light-amount-adjusting laser light source 10x, leads to the photodiode 31.

The CGH is different from holography, and is a hologram that is an object as data of computer.

Specifically, the computer generated hologram is formed by using a computer to perform physics simulations such as a reflection of light, diffraction, interferences, or the like, and to calculate data of interference fringes formed on a hologram face, and by using a display device or the like.

The CGH is classified to an amplitude hologram and a phase hologram from the viewpoint of difference of methods for calculating.

The amplitude hologram is classified to a cell type hologram such as a Lahman type or Lee type, a point-displaying hologram such as an off-axis type, interference type, and the like.

The phase hologram is classified as a kinoform type and a Dammann type.

The photodiode 31 receives the light of light-amount-adjusting laser light source 10x emitted from the hologram element 29.

The I/V conversion section 33 (light amount detection section) is electrically connected with the photodiode 31, and converts the amount of light received by the photodiode 31 into the amount of detection that is electrical signal.

In addition, the I/V conversion section 33 is electrically connected with the switch control circuit 27 of the light source driving section 26.

This electrical signal is transmitted to the switch control circuit 27, and is output to a current adjusting circuit 30 that is the driving value adjusting circuit after performing the computing process in the switch control circuit 27.

The light source control circuit 28 includes at least one current adjusting circuit 30 (driving value adjusting circuit) and a plurality of switching circuits 18.

Specifically, the current adjusting circuit 30 is connected in series with one light-amount-adjusting laser light source 10x (indicated to left end-side in FIG. 11) of the ten laser light sources 10, and the switching circuit 18 is connected in series with the remaining nine laser light sources 10y.

The light source control circuit 28 controls the amount of laser light emitted from the laser light sources 10 by varying the electric current value of the light source driving circuit 14.

The light source control circuit 28 adjusts luminance by controlling the amount of variation of the current adjusting circuit 30.

The current adjusting circuit 30 adjusts the driving value that is supplied to the light-amount-adjusting laser light source 10x based on the electrical signal that is the amount of detection detected by the photodiode 31 and the I/V conversion section 33 (i.e., based on the amount of light emitted from the hologram element 29).

The light-amount-adjusting laser light source 10x is driven by the driving value that is adjusted in this manner, brightness in the light-amount-adjusting laser light source 10x is adjusted.

As a method for adjusting the brightness of the light-amount-adjusting laser light source 10x, a method for varying the supply voltage and a method for varying the duty width are adopted.

The light source driving circuit 14 causes the electric current value that is supplied to the light-amount-adjusting laser light source 10x to be continuously varied.

One current adjusting circuit 30 is connected in series with one laser light source 10.

The current adjusting circuit 30 is an element for varying the amount of driving electric current that is supplied to the laser light source 10.

The nine laser light sources 10y that are connected with the switching circuits 18 are driven by the first electric current value or by the second electric current value is in one state of non-lighting or lighting (lighting by constant amount of light emitted). In contrast, only light-amount-adjusting laser light source 10x that is connected with the current adjusting circuit 30 can finely adjust the amount of light emitted independently.

Specifically, when the current adjusting circuit 30 is turned on and the amount of electric current is adjusted, a forward electric current flows to the laser light source 10 that is connected with the current adjusting circuit 30, and lighting is continued while adjusting the amount emitted of the laser light source 10.

In contrast, when the current adjusting circuit 30 is turned off, the electric current does not flow in the forward direction.

After turning the laser light source 10 off, when the current adjusting circuit 30 is turned on and the amount of electric current is adjusted, the electric current flows in the forward direction, and the laser light source 10 is lit again, while adjusting the amount of light emitted.

That is, by turning on one current adjusting circuit 30 and adjusting the amount of electric current, or by turning off the current adjusting circuit 30, the whole amount of light emitted is controlled while adjusting the amount of light emitted of one laser light source 10.

As a current adjusting circuit 30, a three-terminal element such as a transistor that is a semiconductor element operating amplification, or the like may be used.

Furthermore, the switch control circuit 27 is provided to the light source driving section 26. The switch control circuit 27 controls each switching circuit 18 to be in a state of tuning on or tuning off, and the electric current value that is supplied to the light-amount-adjusting laser light source 10x from the current adjusting circuit 30.

Specifically, when the switching circuit 18 and the current adjusting circuit 30 is constituted by, for example, a three-terminal transistor, the switch control circuit 27 controls voltage that is supplied to a gate terminal of the transistor of each of the switching circuit 18 and the current adjusting circuit 30.

Therefore, the number of gradations is determined by the number of laser light sources 10 (emission section). If the number of laser light sources is small, flickering may occur. However, by varying the electric current value of at least one light-amount-adjusting laser light source 10x, the number of gradations increases, and it is possible to reduce flickering.

Figure 12:
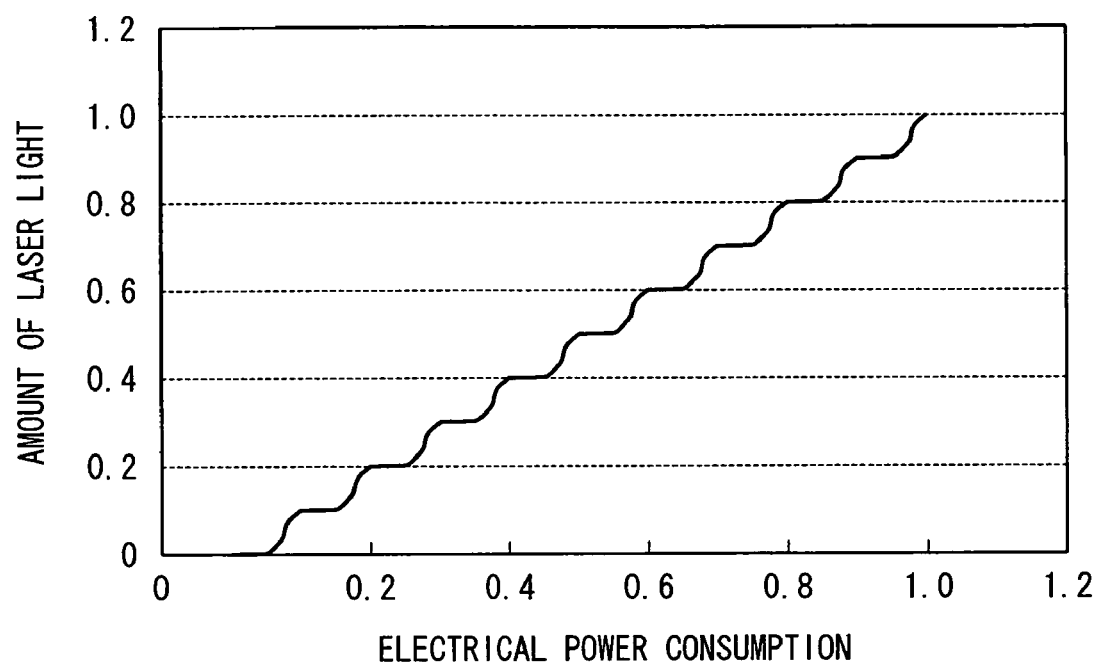
FIG. 12 is a view illustrating the relationship between electric power consumption and output in the third embodiment of the invention.

FIG. 12 illustrates the relationship between electric current supply and the amount of light emitted in the third embodiment of the invention.

The axis of abscissa represents the electric current supply, and the axis of ordinate represents the amount of light emitted.

The amount of light emitted is smoothly varied in each step, compared with characteristics formed in an angular and step-wise form as shown in FIG. 5.

This shows that, since the number of gradations is determined by the number of laser light sources (emission section), flickering may occur if the number of laser light sources (emission section) is small. However, by controlling at least one laser light source 10 by the continuous electric current value, it is possible to finely fill between the step-wise gradations, increase the number of gradations, and flickering is not conspicuous.

The driving method of the laser light source device 4 includes a step for driving a light source that controls at least one laser light source 10 by continuous electric current value.

For example, as shown in FIG. 11, by controlling the electric current value of the current adjusting circuit 30, it is possible to obtain 0% to 10% of the total amount of light emitted from one laser light source 10.

It is possible to obtain 10% to 20% of the total amount of light emitted by combining 10% of the total amount of light emitted that is obtained by turning on one laser light source 10 by the switching circuit 18, and 0% to 10% of the total amount of light emitted that is obtained by controlling the electric current value to drive one laser light source 10 by the current adjusting circuit 30. For example, if the amount of light emitted is controlled by the current adjusting circuit 30 in each increment of 1%, it is possible to obtain the 10%, 11%, 12% to 18%, 19%, and 20% of the total amount of light emitted.

Similarly, it is possible to obtain 20% to 30% of the total amount of light emitted by combining the 20% of the total amount of light emitted that is obtained by turning on two laser light sources 10 by the switching circuits 18, and 0% to 10% of the total amount of light emitted that is obtained by controlling the electric current value to drive one laser light source 10 by the current adjusting circuit 30.

As similar manner, it is possible to obtain smooth variations of the amount of light emitted, that is 30% to 40%, 40% to 50%, to 90%, and up to 100% of the total amount of light emitted.

It is thereby possible to reliably control the output and vary the amount of light emitted by fine increment.

According to this embodiment, in the first embodiment in which performing the only driving method by the two electric current values, the step-wise amount of light emitted is only obtained in accordance with the number of laser light sources. As a countermeasure for solving the above, it is possible to cause the amount of light emitted in a step-wise increase to approach realization of the continuous amount of light emitted by increasing the number of laser light sources. However, there is a limitation because a decrease in the size of the light source is limited or the like. Therefore, by controlling at least one laser light source by the continuous electric current value, and further finely controlling the amount of light emitted while reliably controlling the amount of light emitted in a step-wise increase corresponding to the number of laser light sources is easy.

In addition, in this embodiment, the light emitted from the light-amount-adjusting laser light source 10x is incident into the hologram element 29, and the hologram element 29 leads the light emitted from the light-amount-adjusting laser light source 10x to the hologram element 29.

Therefore, the amount of light emitted that is actually emitted from the light-amount-adjusting laser light source 10x is detected by the photodiode 31 via the hologram element 29.

As a result, the feedback control is performed by the switch control circuit 27 and the current adjusting circuit 30 based on the actual amount of light emitted.

It is thereby possible to adjust the driving value that is supplied to the light-amount-adjusting laser light source 10x.

Therefore, it is possible to reliably control the discrete amount of light emitted corresponding to the number of laser light sources, to finely adjust the amount of light emitted, and to furthermore adjust the amount of light emitted with a high level of precision.

Furthermore, the hologram element 29 complements the function of light detection by the photodiode 31, and can reliably lead the light to the photodiode 31.

In addition, for example, when the photodiode 31 is adjacently disposed to the light-amount-adjusting laser light source 10x, or the like. That is, when the photodiode 31 can sufficiently detect the light emitted from the light-amount-adjusting laser light source 10x, the hologram element 29 may not be used.

In addition, when the laser light source device of this embodiment is applied to an optical device including a uniformization optical system (uniformization optical element), such as a monitor device or a projector, the hologram element 29 may constitute a part of the uniformization optical system.

The uniformization optical system functions to uniformize illumination distribution of the light emitted from the laser light sources 10 and 10x.

As a result, it is possible to achieve a reduction in the number of components constituting the optical device that includes the light source device.

Fourth Embodiment

Next, a fourth embodiment of the invention will be described.

Figure 13:
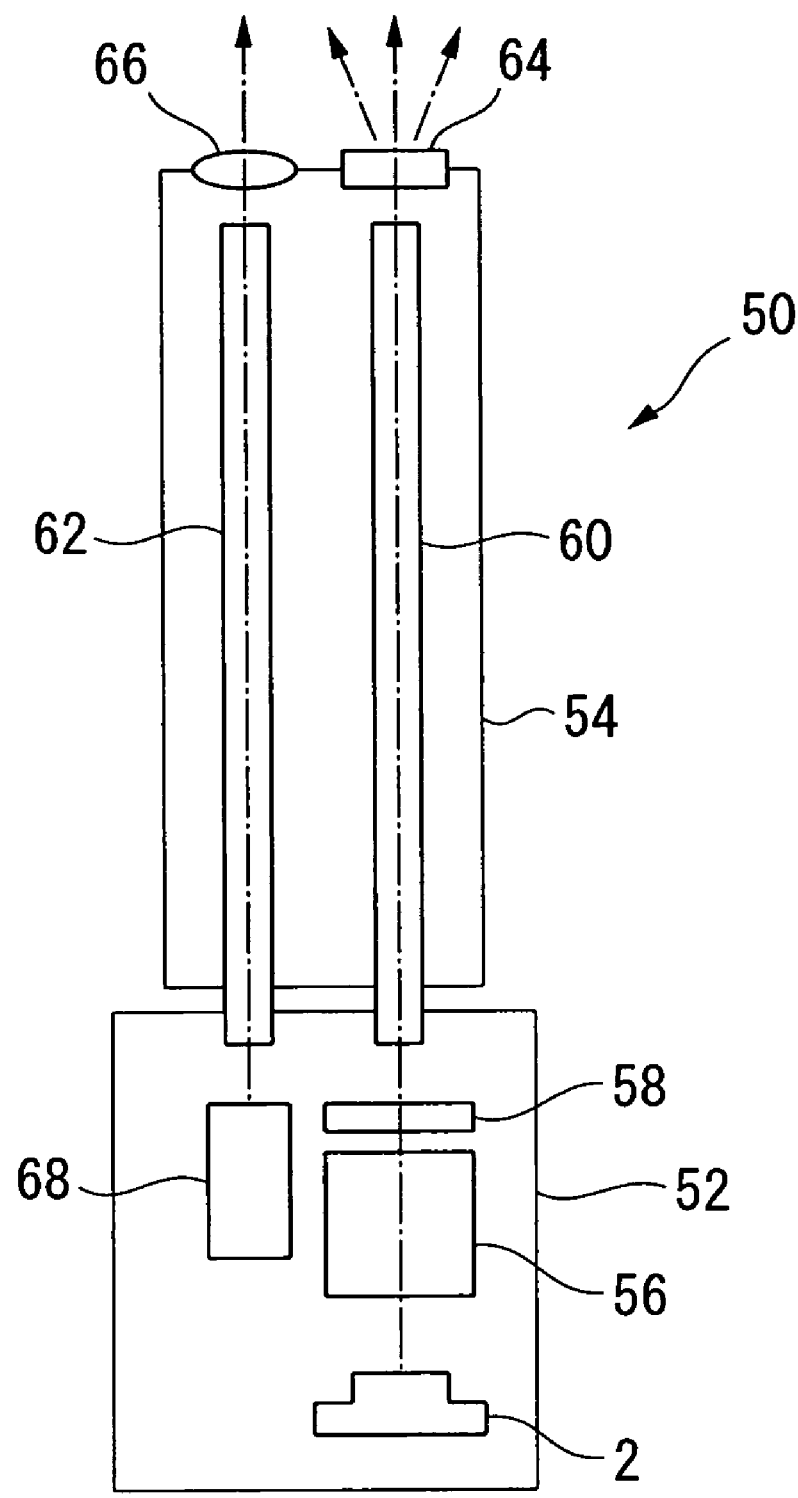
FIG. 13 is a schematic block diagram of a monitor device of a fourth embodiment of the invention.

FIG. 13 schematically shows the constitution of a monitor device of the fourth embodiment of the invention.

The monitor device 50 of this embodiment includes a main body 52 and a light transmission section 54.

The main body 52 includes the above-described laser light source device 2 of the first embodiment, and includes a light-wavelength conversion element 56 and a reflection mirror 58 as an accompaniment.

The light transmission section 54 includes two light guides. That is, the light guide 60 that transmits light and the light guide 62 that receives light.

Each of the light guides 60 and 62 is constituted from a plurality of optical fibers that are sheaved and can transmit laser lights a distance by using the light guides 60 and 62.

The laser light source device 2 is disposed at the incident side of the light guide 60. A diffusing plate 64 is disposed at the emission side of the transmitting light guide 60.

The laser light emitted from the laser light source device 2 is transmitted through the light guide 60 to the diffusing plate 64 disposed at the distal end of the light transmission section 54, and is diffused by the diffusing plate 64, and illuminates an object.

Also, an image-formation lens 66 is disposed at the distal end of the light transmission section 54, and it is thereby possible to receive the reflection light from the object.

The reflection light that is received by the image-formation lens 66 is transmitted through the receiving light guide 62 to a camera 68 that functions as an image capturing section and that is provided in the main body 52.

As a result, due to the laser light emitted from the laser light source device 2, the object is illuminated, the reflection light reflected by the object is obtained, and the image formed by the reflection light can be captured by the camera 68.

According to the monitor device 50 that is constituted by the above-described manner, by varying each of the number of laser light sources that are driven by the first electric current value and the number of laser light sources that are driven by the second electric current value, the amount of laser light that is emitted from the laser light sources. The first electric current value is the value less than the threshold level of a laser light of the laser light source, and the second electric current value is a value greater than the threshold level of a laser light of the laser light sources. It is thereby possible to provide a monitor device that can reliably control the total output (total amount of light emitted) while reducing the adverse effects caused by the individual differences between the laser light sources.

Specifically, as the first and second electric current values, the values that are different from the threshold level of laser light at which the great influence of the individual differences in the laser light sources occurs are set. Also, the number of light sources that are driven by the first and second electric current values that are different from the threshold level are controlled. It is thereby possible to reliably control the output.

Fifth Embodiment

Next, a fifth embodiment of the invention will be described.

Figure 14:
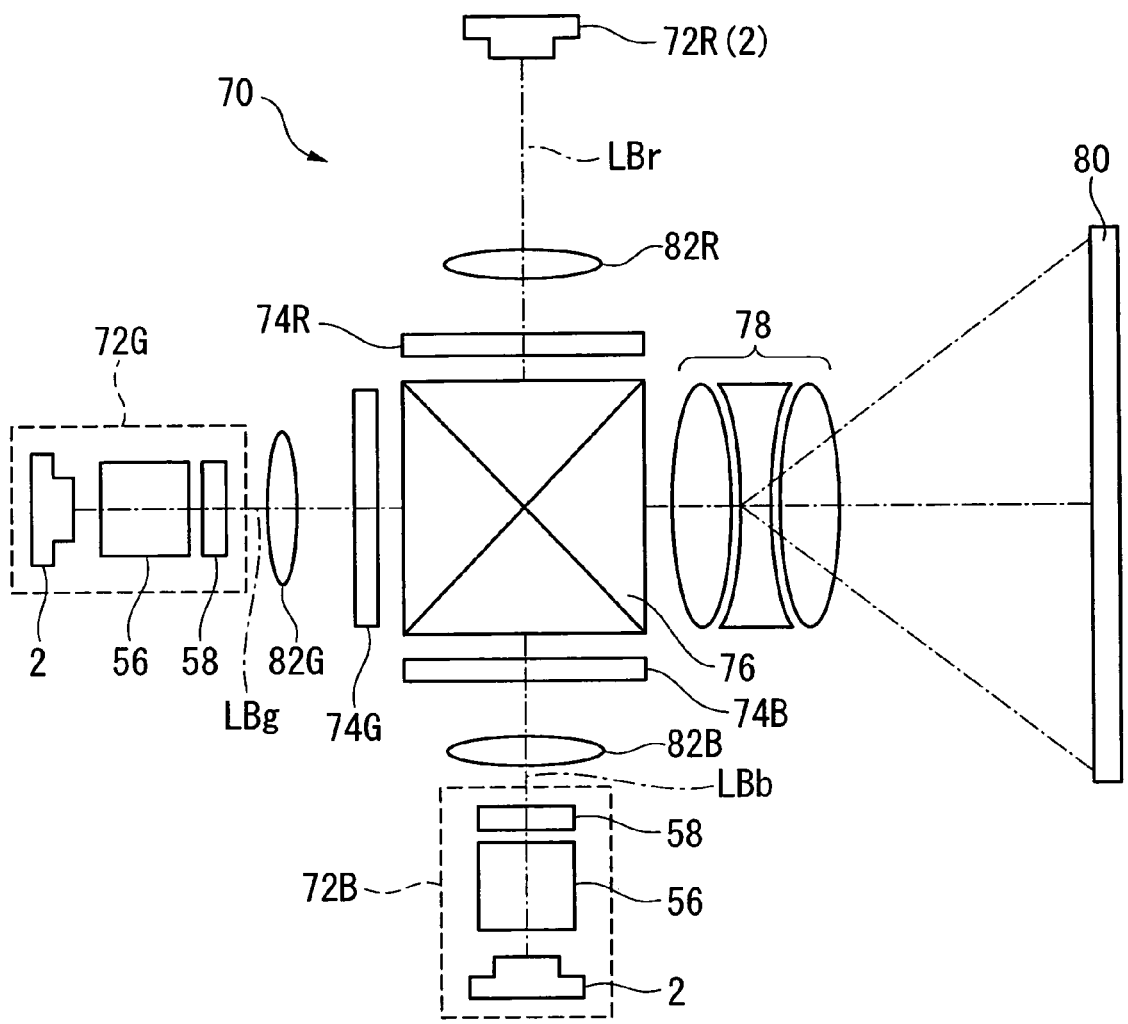
FIG. 14 is a schematic block diagram of a projector of a fifth embodiment of the invention.

FIG. 14 schematically shows constitution of a projector of the fifth embodiment of the invention.

An enclosure constituting a projector 70 are omitted in FIG. 14 for simplification.

The projector 70 of this embodiment includes a red-colored laser light source device 72R emitting red-colored light, a green-colored laser light source device 72G emitting green-colored light, and a blue-colored laser light source device 72B emitting blue-colored light.

The red-colored laser light source device 72R includes the constitution identical to the above-described laser light source device 2 of the first embodiment, and is a semiconductor laser array that emits a red-colored laser light LBr.

The green-colored laser light source device 72G includes the constitution identical to the above-described laser light source device 2 of the first embodiment, and includes the light-wavelength conversion element 56 and the reflection mirror 58 as an accompaniment.

In the light-wavelength conversion element 56, the wavelength-conversion is performed so as to emit the laser light LBg of a green-color wavelength.

The blue-colored laser light source device 72B includes a constitution identical to the above-described laser light source device 2 of the first embodiment, and includes the light-wavelength conversion element 56 and the reflection mirror 58 as an accompaniment.

In the light-wavelength conversion element 56, the wavelength-conversion is performed so as to emit the laser light LBb of a blue-color wavelength.

Furthermore, the projector 70 includes liquid crystal light valves 74R, 74G, and 74B (modulation section), a cross-dichroic prism 76 (light-synthesization section), and projection lens 78 (projection section).

The liquid crystal light valves 74R, 74G, and 74B modulate the laser lights LBr, LBg, and LBb emitted from the laser light source devices 72R, 72G, and 72B, respectively, in accordance with image signals that are transmitted from a personal computer or the like.

The cross-dichroic prism 76 synthesizes the light emitted from the liquid crystal light valves 74R, 74G, and 74B, and leads the light to a projection lens 78.

The projection lens 78 enlarges the image formed by the liquid crystal light valves 74R, 74G, and 74B, and projects the image onto a screen 80.

Furthermore, in the projector 70, uniformization optical systems 82R, 82G, and 82B (uniformization optical element) are provided at the positions into which the lights emitted from the laser light source devices 72R, 72G, and 72B are incident, in order to uniformize the illumination distribution of the laser lights that are emitted from the laser light source devices 72R, 72G, and 72B.

Therefore, with the light whose illumination distribution is uniformized, the liquid crystal light valves 74R, 74G, and 74B are illuminated.

The uniformization optical systems 82R, 82G, and 82B are constituted by, for example, a hologram or a field lens.

In addition, when a hologram is used as the uniformization optical systems 82R, 82G, and 82B, the hologram has not only the function of uniformizing illumination distribution, but also may have the function of leading laser light to the photodiode 31, that is, the function of the hologram element 29 as shown in FIG. 11.

As a result, since the projector does not need the hologram for monitoring the light-amount-adjusting laser light source 10x, it is possible to achieve a reduction in the number of components constituting a projector.

The three colored lights that is modulated by each the liquid crystal light valves 74R, 74G, and 74B is incident into the cross-dichroic prism 76.

This prism is formed by pasting four right-angle prisms. Dielectric multi-layers that reflect red-colored light and dielectric multi-layers that reflect blue-colored light are disposed in the shape of an X on the inside face of the prism.

Three colored light are synthesized by the dielectric multi-layers, and the light that shows the color image is formed.

The synthesized light is projected by the projection lens 78 that is a projection optical system on to the screen 80, and the image that is enlarged is displayed.

According to the projector 70 that is constituted by the above-described manner, by varying each of the number of laser light sources that are driven by the first electric current value and the number of laser light sources that are driven by the second electric current value, the amount of laser light that is emitted from the laser light sources is controlled. The first electric current value is a value less than the threshold level of laser light of the laser light source, and the second electric current value is a value greater than the threshold level of laser light of the laser light sources. Since the output of a light source is reliably controlled in accordance with an image signal or the like while reducing the adverse effects caused by the individual differences between the laser light sources, it is thereby possible to provide a projector with higher-resolution.

Specifically, as the first and second electric current values, the values that are different from the threshold level of laser light at which the great influence of the individual differences in the laser light sources occurs are set. Also, the number of light sources that are driven by the first and second electric current values that are different from the threshold level are controlled. It is thereby possible to reliably control the output.

As a result, it is possible to achieve a projector projecting a superior image with broad dynamic range due to a combination with adjustment of the amount of light emitted from the light source and modulation by the modulation section.

In addition, as a light modulation device, a transmissive liquid crystal light valve is used, however, a light valve other than a liquid crystal may be used, and a reflective light valve may be used.

As these light valves, for example, a reflective liquid crystal light valve or a Digital Micro mirror Device may be adopted.

The constitution of a projection optical system is optionally modified depending on the light valve that is used therein.

In addition, the invention is not limited by the above-described embodiments, and other modifications can be made without departing from the spirit or scope of the invention.

In the above-described embodiment, the emission light emitted from the laser light source is controlled by directly controlling the electric current value. However, the emission light emitted from the laser light source may be controlled by controlling voltage value, accordingly by controlling the electric current value.

Alternatively, the emission light emitted from the laser light source may be controlled by controlling electric power value and by controlling the electric current value as a result.

In the above-described, as a semiconductor laser array, a VCSEL type is used. Instead of this, an edge emission type semiconductor laser array whose light resonation direction is parallel to a substrate face may be used.

Furthermore, as a laser light source, a solid laser, a liquid laser, a gas laser, a free-electron laser, or another type laser can be used instead of a semiconductor laser.

In addition, the projector 70 of the above-described embodiment is a so-called three-plate type liquid crystal projector. Instead of this, a single-plate type liquid crystal projector may be used that causes a laser light source device to light with each color and with time division, and that can thereby display colored light by using only one light valve. In addition, a scanning type projector may be used.

What is claimed is:

1. A light source device comprising:
    a plurality of laser light sources that emit laser light; and
    a light source driving section that drives at least one of the laser light sources by a first driving value that is a value less than a threshold level of at least one of the laser light sources, or by a second driving value that is a value greater than a threshold level of at least one of the laser light sources, and that varies at least one of a number of laser light sources that are driven by the first driving value and a number of laser light sources that are driven by the second driving value in the laser light sources, thereby controlling the total output of laser light emitted from the laser light sources, the light source driving section being connected in series with at least one of the laser light sources, the light source driving section including a switching circuit supplying the laser light sources with one of the first driving value and the second driving value, the light source driving section including the switching circuit connected in series with one of the laser light sources, and the light source driving section including a driving value adjusting circuit connected in series with a light-amount-adjusting laser light source that is not connected to the switching circuit,
    wherein one of the first driving value and the second driving value is supplied by the switching circuit to the laser light sources that is connected with the switching circuit, and the driving value that is supplied to the light-amount-adjusting laser light source connected with the driving value adjusting circuit is adjusted by the driving value adjusting circuit.

2. The light source device according to claim 1, wherein
    the first driving value is a value less than a lowest threshold level of the threshold levels of the laser light sources, and
    the second driving value is a value greater than a highest threshold level of the threshold levels of the laser light sources.

3. The light source device according to claim 2, wherein
    the first driving value is a driving value by which the output of all of the laser light sources is zero, and
    the second driving value is a value greater than a driving value by which output of all of the laser light sources is maximized.

4. The light source device according to claim 1, further comprising:
    a light amount detection section that detects an amount of light that is emitted from the light-amount-adjusting laser light source, wherein
    the driving value adjusting circuit adjusts the driving value that is supplied to the light-amount-adjusting laser light source, based on the amount of light that is detected by the light amount detection section.

5. The light source device according to claim 1, wherein
    the light amount detection section includes an optical element that leads a part of the light emitted from the light-amount-adjusting laser light source.

6. The light source device according to claim 5, wherein
    the optical element constitutes a part of a uniformization optical element that uniformizes the illumination distribution of the light emitted from the laser light sources and the light-amount-adjusting laser light source.

7. The light source device according to claim 1, wherein
    the laser light sources are configured in an array.

8. A monitor device comprising:
    the light source device according to claim 1; and a capturing section that captures an object that is illuminated by the light source device.

9. A projector comprising:
the light source device according to claim 1; and
a modulation section that modulates the light from the light source device in accordance with an image signal.

10. A light source device comprising:
a plurality of laser light sources that emit laser light;
a light source driving section that drives at least one of the laser light sources by a first driving value that is a value less than a threshold level of the laser light sources, or by a second driving value that is a value greater than a threshold level of at least one of the laser light sources, and that varies at least one of the of laser light sources that are driven by the first driving value and the of laser light sources that are driven by the second driving value in the laser light sources, thereby controlling the total output of laser light emitted from the laser light sources; and
a storage section that stores historical drive information with regard to each of the laser light sources that are turned on or off depending on a passage of time, wherein
the light source driving section includes a light source control circuit that selectively drives each of the laser light sources, based on the historical drive information stored in the storage section.

11. The light source device according to claim 10, wherein
the first driving value is a value less than a lowest threshold level of the threshold levels of the laser light sources, and
the second driving value is a value greater than a highest threshold level of the threshold levels of the laser light sources.

12. The light source device according to claim 11, wherein
the first driving value is a driving value by which the output of all of the laser light sources is zero, and
the second driving value is a value greater than a driving value by which output of all of the laser light sources is maximized.

13. A monitor device comprising:
the light source device according to claim 10; and
a capturing section that captures an object that is illuminated by the light source device.

14. A projector comprising:
the light source device according to claim 10; and
a modulation section that modulates the light from the light source device in accordance with an image signal.

15. A driving method for driving a light source device, comprising:
driving a plurality of laser light sources by a first driving value that is a value less than a threshold level of at least one of the laser light sources, or by a second driving value that is a value greater than a threshold level of at least one of the laser light sources; and
varying at least one of a number of laser light sources that are driven by the first driving value and a number of laser light sources that are driven by the second driving value in the laser light sources, thereby controlling the total output of the laser light emitted from the laser light sources; and
storing historical drive information with regard to each of the laser light sources that are turned on or off depending on a passage of time, wherein
each of the laser light sources is selectively driven based on the historical drive information stored in the storing of the historical drive information, in the driving of the light source.

16. The driving method according to claim 15, wherein
the laser light sources include a first laser light source and a second laser light source, and wherein
the first laser light source is driven by the first driving value or the second driving value, and the second laser light source is driven by varying the driving value that is supplied to the second laser light source, in the driving of the light source.

17. The driving method according to claim 15, wherein
drive of at least one of the laser light sources that has been driven at a first step is stopped at a second step after the first step, and at least one of the laser light sources that has not been driven in the first step is driven at the second step, in the driving of the light source.

18. The driving method according to claim 15, wherein
the historical drive information includes previous drive information with regard to the laser light source and whether or not the laser light source has been driven in the previous step, and wherein
drive of the laser light source that has been driven is stopped based on the previous drive information, in the driving of the light source.

19. The driving method according to claim 15, wherein
the historical drive information includes cumulative drive information with regard to the cumulative number of driving times or the cumulative length of the driving time of each laser light source, and wherein
the laser light source whose number of driving times or whose length of driving time is relatively less than that of the laser light sources is driven, and the laser light source whose number of driving times or whose length of driving time is relatively greater than that of the laser light sources is not driven based on the cumulative drive information, in the driving of the light source.

20. The driving method according to claim 15, wherein
the historical drive information includes continuous drive information with regard to the continuous number of driving times or the continuous length of the driving time of each laser light source, and wherein
the laser light source whose continuous number of driving times or whose continuous length of driving time is relatively less than that of the laser light sources is driven, and the laser light source whose continuous number of driving times or whose continuous length of driving time is relatively greater than that of the laser light sources is not driven based on the continuous drive information, in the driving of the light source.

* * * * *